United States Patent [19]
Tanaka et al.

[11] Patent Number: 4,794,443
[45] Date of Patent: Dec. 27, 1988

[54] SEMICONDUCTOR DEVICE AND PROCESS FOR PRODUCING SAME

[75] Inventors: Nobuyoshi Tanaka, Tokyo; Shigeyuki Matsumoto, Atsugi, both of Japan

[73] Assignee: Canon Kabushiki Kaisha, Tokyo, Japan

[21] Appl. No.: 120,786

[22] Filed: Nov. 16, 1987

Related U.S. Application Data

[63] Continuation of Ser. No. 736,383, May 21, 1985, abandoned.

[30] Foreign Application Priority Data

| May 28, 1984 | [JP] | Japan | 59-106663 |
| May 28, 1984 | [JP] | Japan | 59-106664 |
| May 28, 1984 | [JP] | Japan | 59-106665 |
| May 28, 1984 | [JP] | Japan | 59-106666 |

[51] Int. Cl.$^4$ .......................................... H01L 27/02
[52] U.S. Cl. ..................................... 357/43; 357/45; 357/48; 357/30; 365/177
[58] Field of Search ................ 357/30 I, 30 G, 30 H, 357/43, 45, 48; 365/177

[56] References Cited

U.S. PATENT DOCUMENTS

| 3,529,217 | 9/1970 | van Santen | 317/235 |
| 3,534,236 | 10/1970 | Bean | 317/235 |
| 4,407,010 | 9/1983 | Baji | 357/45 X |
| 4,686,554 | 8/1987 | Ohmi | 357/30 |

FOREIGN PATENT DOCUMENTS

| 55-74417 | 1/1980 | Japan . | |
| 55-1149(A) | 1/1980 | Japan | 357/48 |
| 57-4173 | 1/1982 | Japan . | |

*Primary Examiner*—Martin H. Edlow
*Attorney, Agent, or Firm*—Fitzpatrick, Cella, Harper & Scinto

[57] ABSTRACT

A semiconductor device, e.g. a photoelectric converter, comprises a semiconductor transistor having a semiconductor controlling electrode region of one conductivity type resettable at a desired stage, an element isolation region of the same conductivity type, and an insulated gate type switching transistor for making the controlling electrode region and the element isolation region electrically conductive with each other. The element isolation region is preferably formed by at least two impurity injections with lamination or superposition. A peripheral element may be provided in the same substrate simultaneously with the formation of the semiconductor transistor and the element isolation region.

6 Claims, 25 Drawing Sheets

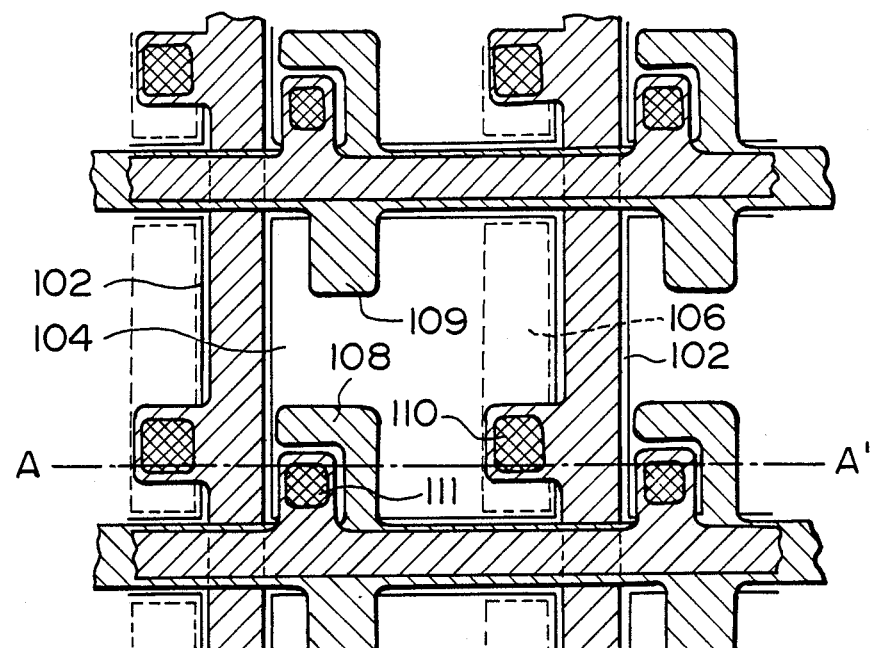
F I G. 1(a)
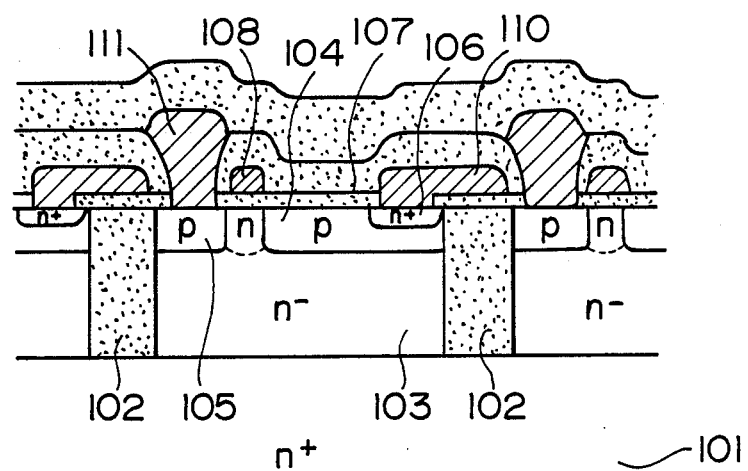
F I G. 1(b)

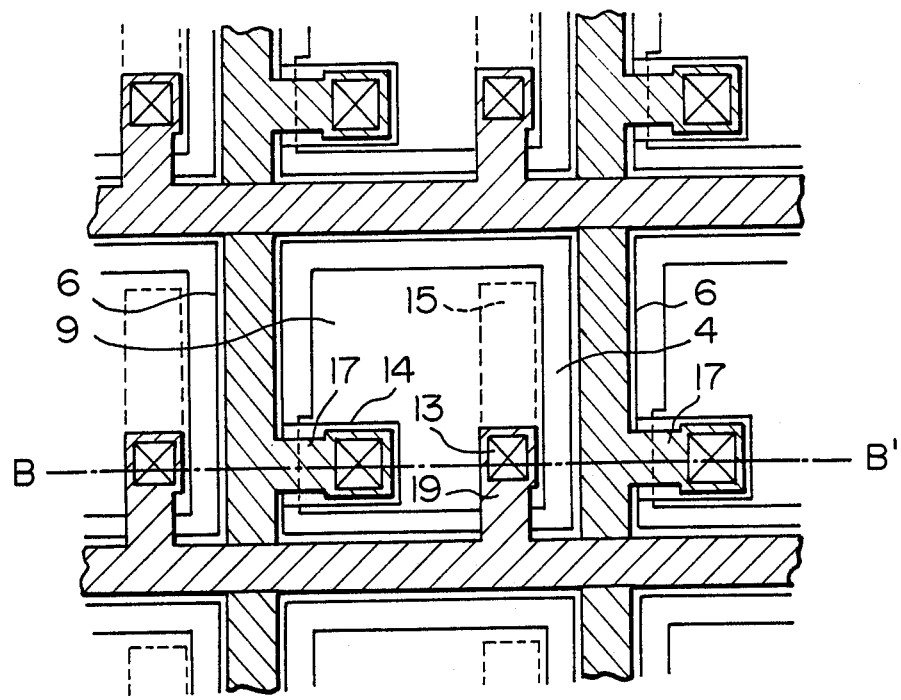
F I G. 2(a)
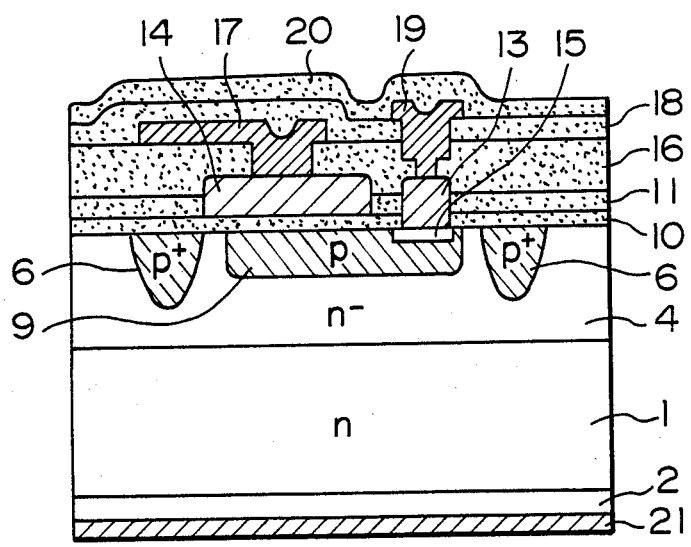
F I G. 2(b)

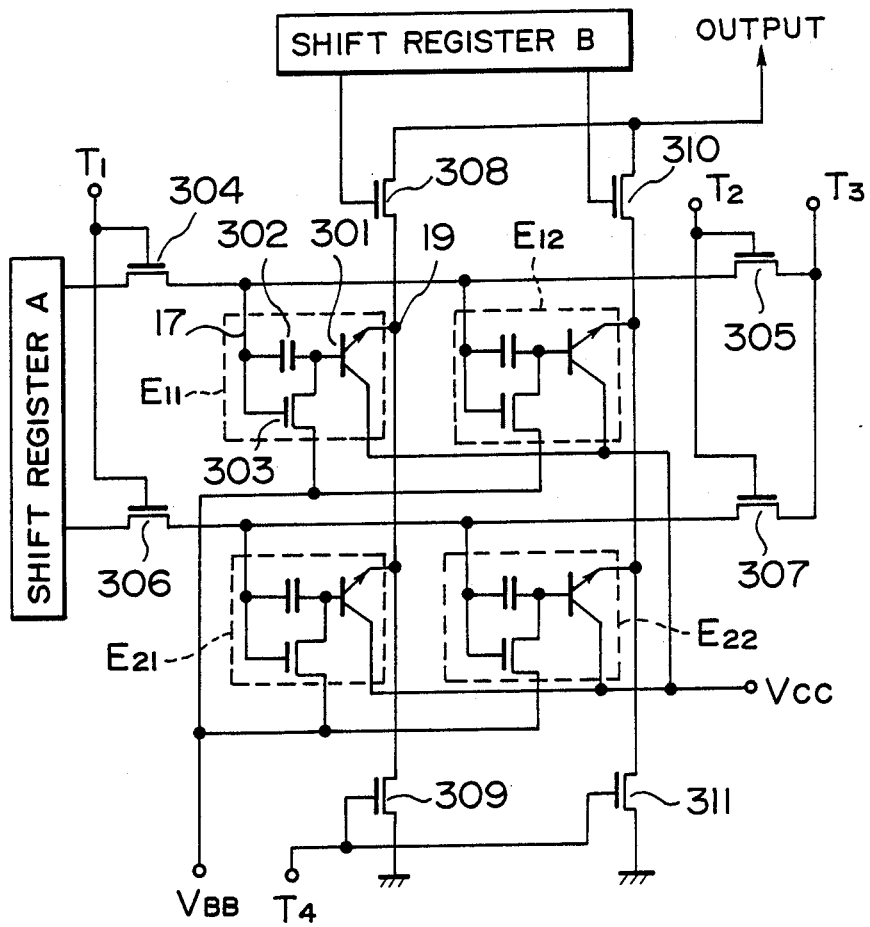
F I G. 3

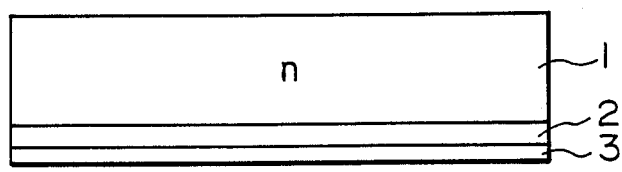
F I G. 4(a)
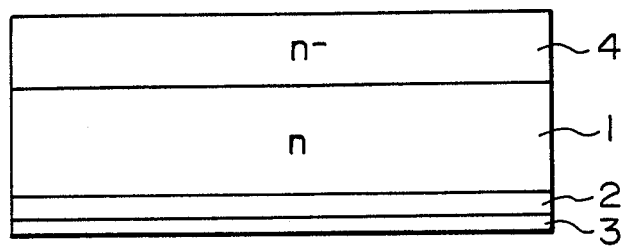
F I G. 4(b)
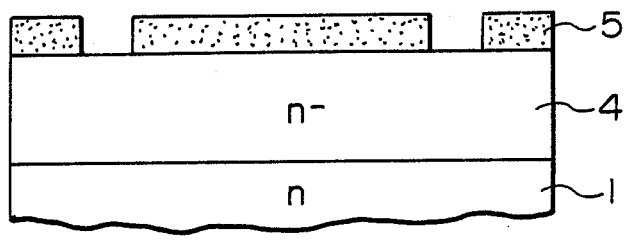
F I G. 4(c)
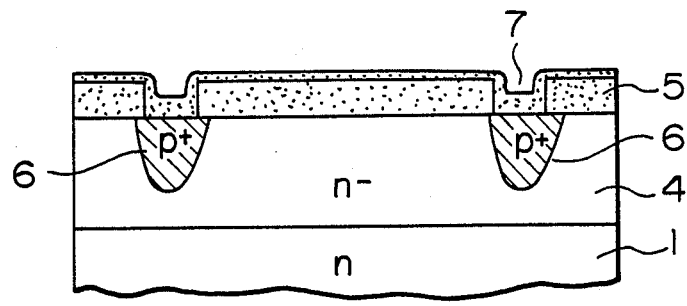
F I G. 4(d)

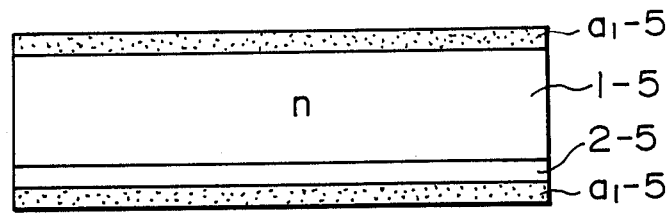
F I G. 5(a)
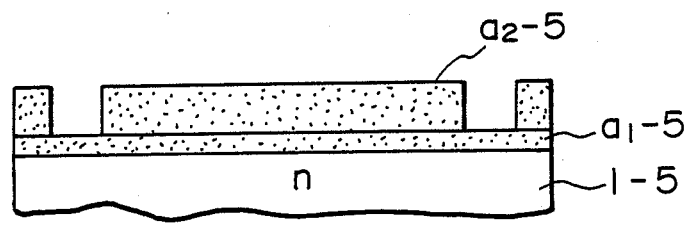
F I G. 5(b)
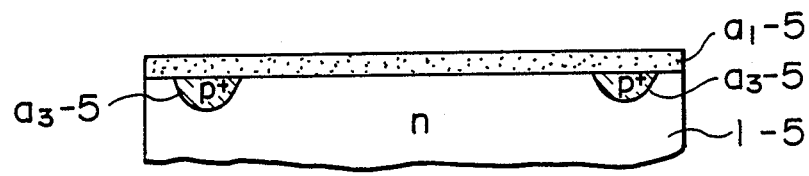
F I G. 5(c)
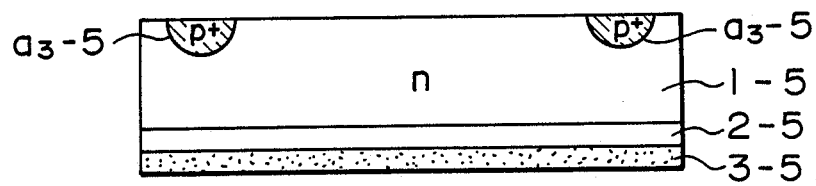
F I G. 5(d)

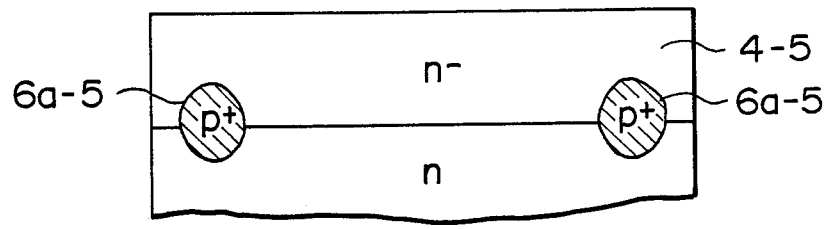
F I G. 5(e)
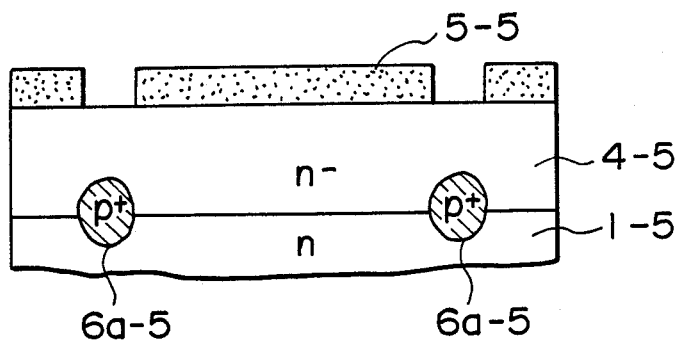
F I G. 5(f)
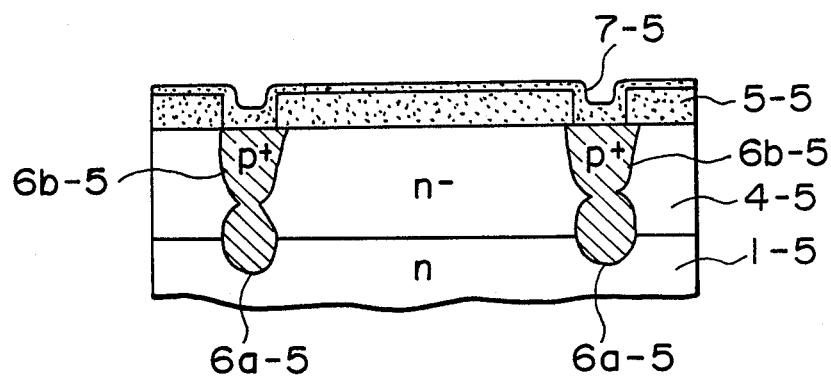
F I G. 5(g)

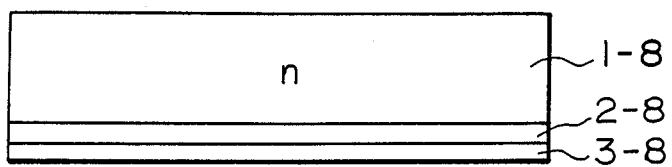
F I G. 8(a)
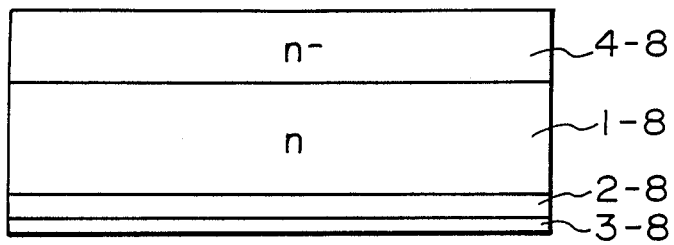
F I G. 8(b)
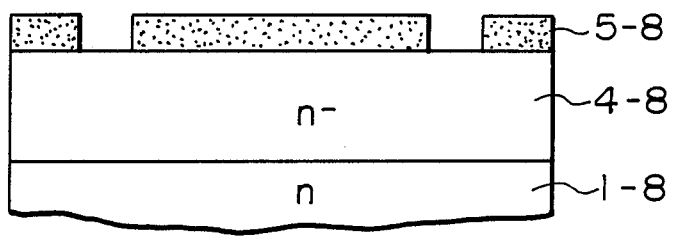
F I G. 8(c)
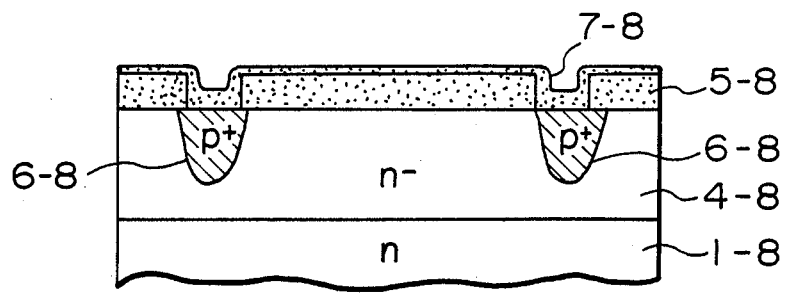
F I G. 8(d)

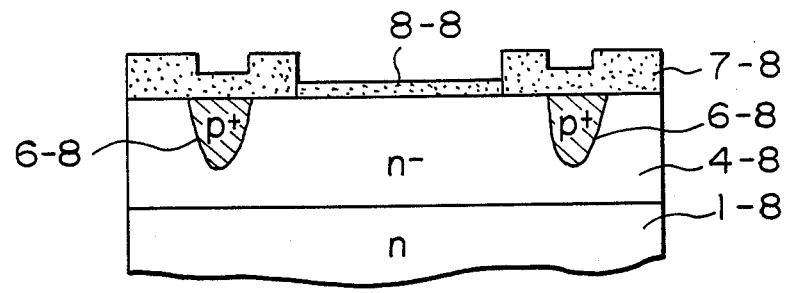
F I G. 8(e)
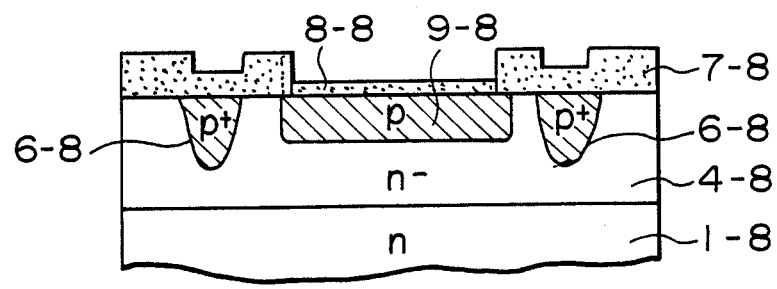
F I G. 8(f)
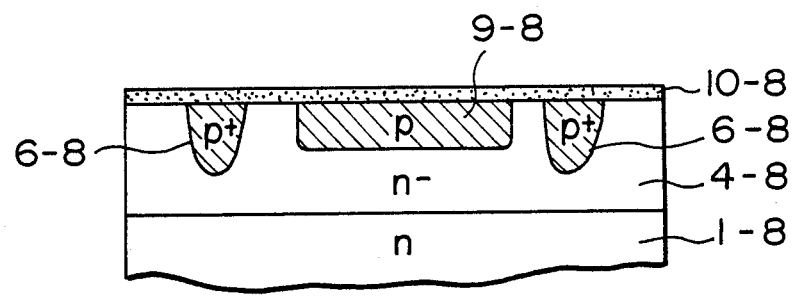
F I G. 8(g)

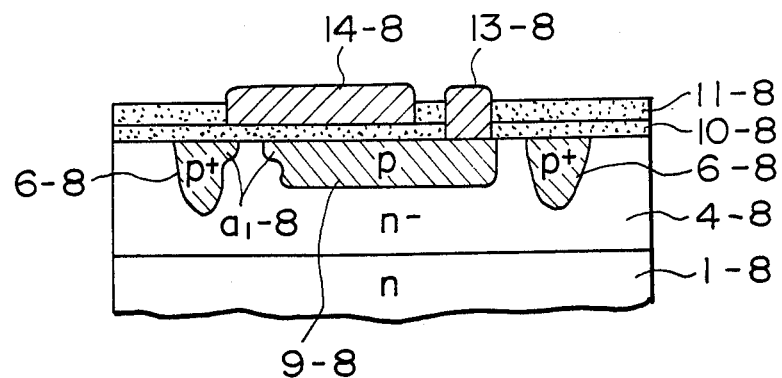
F I G. 8(k)
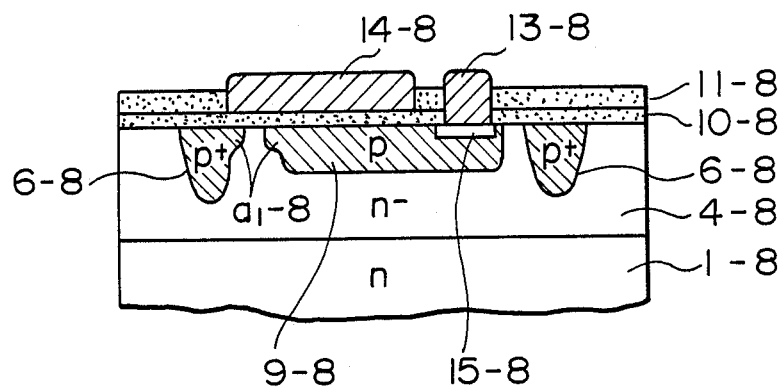
F I G. 8(l)
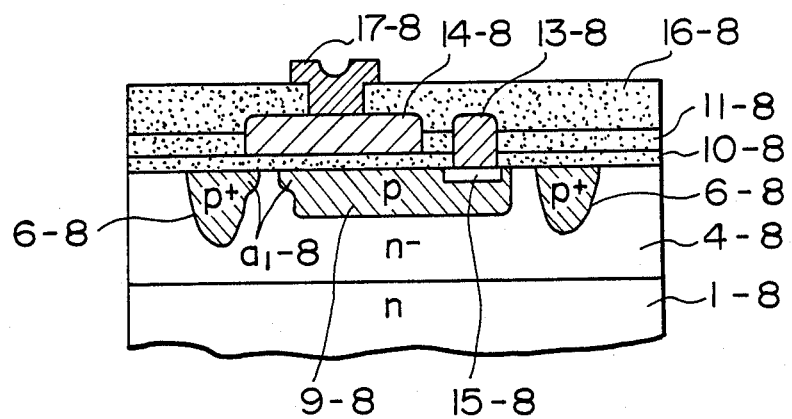
F I G. 8(m)

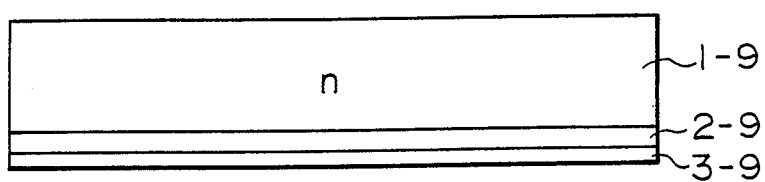
F I G. 9(a)
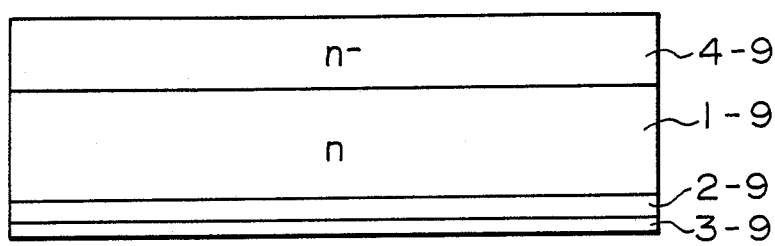
F I G. 9(b)
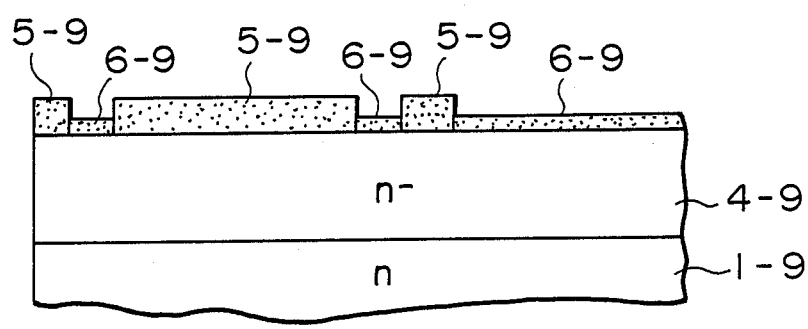
F I G. 9(c)
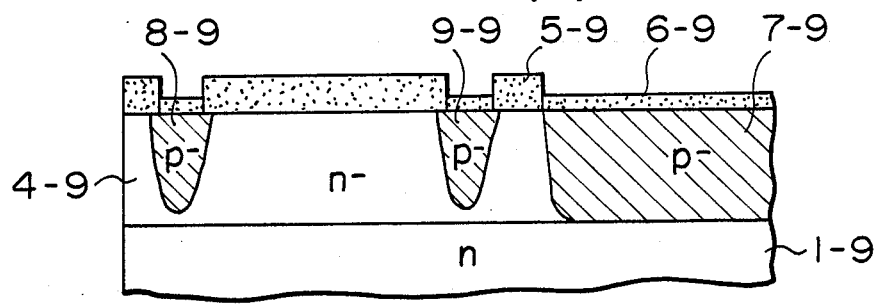
F I G. 9(d)

SEMICONDUCTOR DEVICE AND PROCESS FOR PRODUCING SAME

This application is a continuation of application Ser. No. 736,383, filed May 21, 1985, now abandoned.

BACKGROUND OF THE INVENTION

The present invention relates to a semiconductor device, having element or cell isolation regions and particularly to a semiconductor device effectively utilizing an element isolation region formed of a semiconductor of one conductivity type and a process for producing the same.

The semiconductor device of the present invention is applicable to, for example, a photoelectric converter of the type in which carriers generated by photoexcitation are stored and a stored voltage generated by the stored carriers is read out.

A photoelectric converter has been proposed by our research group in U.S. patent application Ser. No. 625,130 as shown in FIGS. 1(a) and 1(b), of which FIG. 1(a) is a plan view of the photoelectric converter comprising photosensor cells arranged two-dimensionally and FIG. 1(b) is a sectional view taken along the line A-A' in FIG. 1(a).

Referring to FIGS. 1(a) and 1(b), photosensor cells are arranged on an n+ silicon substrate 101, and each photosensor cell is electrically isolated from a neighboring photosensor cell by a cell or element isolation region 102 formed of $SiO_2$, $Si_3N_4$, polysilicon, etc.

Each photosensor cell is constituted by an n⁻ region 103 with a low impurity concentration, a p region 104 formed thereon and doped with a p-type impurity (e.g., boron) forming a base of a bipolar transistor and also a source of a p-channel MOS transistor, a p region 105 formed also on the n⁻ region 103 and forming a drain of the p-channel MOS transistor, an n+ region forming an emitter of the bipolar transistor, a gate electrode 108 of the p-channel MOS transistor formed through an oxide film 107, a MOS capacitor electrode for applying pulses to the p region 104 through the oxide film 107, an emitter electrode 110, and an electrode 111 for imparting a predetermined potential to the p region 105, as main parts thereof.

The photosensor cell operates in the following manner.

First, in the charge storage operation, the base p region 104 is biased to a negative potential relative to the n+ region 106, thereby to store therein holes generated by incident light. As the holes are accumulated, the potential of the p region is changed in the positive direction, while the resultant potential varies depending on the intensity of the light incident on each photosensor cell.

The readout operation is then carried out. More specifically, when a readout pulse voltage $V_R$ is applied to the MOS capacitor electrode, the potential of the p region becomes positive and the light information stored is read out to the emitter n+ region 106. Then, the readout pulse voltage is changed to a ground potential, whereby the information is output from the n+ region 106 through the emitter electrode 110 to the exterior.

Then, in the state where the potential of the p region 104 varies depending on the intensity of the incident light, a negative pulse is applied to the gate electrode 108 to effect a refreshing operation. By the negative pulse, the p channel MOS transistor is turned on, whereby the holes stored in the p region 104 are removed and p region 104 is brought to and fixed at a predetermined negative potential. Thus, by this refreshing operation, the p region 104 which is a base is completely initialized. Thereafter, the above-mentioned storage, readout and refreshing operations are respectively repeated.

In this manner, by fixing the base p region 104 at a predetermined negative potential during the refreshing operation, the light information is erased completely and at a high speed regardless of whether the light is strong or weak.

However, it is particularly desired in a photoelectric converter that the device area is utilized to the maximum in order to satisfy the requirement for improvement in photosensitivity and higher resolution.

In this respect, the photoelectric converter as described above has left room for further improvement. More specifically, because the device shown in FIG. 1 has a cell isolation region 102 formed of an insulating material, it becomes larger by the area of the region 102 and moreover is required to be provided with a particular line for applying a negative voltage to one main electrode region 105 of the p-channel MOS transistor which is turned on during the refreshing step.

On the other hand, when a cell isolation region of a semiconductor is formed throughout a chip with a width of 2 to 4 μm, the resistivity becomes 2500 to 5000 times the sheet resistivity, whereby there arises a problem that a potential distribution is generated. When the cell isolation region is more deeply formed, the width becomes larger likewise, thus increasing the loss of device area.

Furthermore, as an independent step for providing a cell isolation region of an insulating material is required, the overall production process becomes complicated particularly when peripheral devices or elements are formed on the same chip.

SUMMARY OF THE INVENTION

An object of the present is to provide an improved semiconductor having solved the problems as mentioned above and a process for producing the same.

Another object of the present invention is to provide a semiconductor device having a simplified structure and effectively utilizing the device surface, and a process for producing the same.

Still another object of the present invention is to provide a process for producing a semiconductor device, which realizes complete cell or element isolation, has a cell isolation region with a low resistivity and effectively utilizes the device surface.

A further object of the present invention is to provide a semiconductor device in which a controlling electrode region (base region) is reliably reset to a predetermined potential and which has a simplified structure effectively utilizing the device surface.

More specifically, the semiconductor device of the present invention comprises: a semiconductor element comprising at least a semiconductor region of one conductivity type which is reset to a predetermined potential at a desired stage; and element isolation region comprising a semiconductor of the one conductivity type; and switching means for making the semiconductor region and the element isolation region electrically conductive with each other at a desired stage.

The present invention also provides a preferred process for producing the semiconductor device of the type as described above. Thus, the element isolation region is preferably formed through at least two times of impurity injection by way of either lamination or superposition. A peripheral element may be provided in the same semiconductor layer simultaneously with the formation of the semiconductor element and element isolation region.

These and other objects, features and advantages of the present invention will become more apparent upon a consideration of the following description of the preferred embodiments of the present invention taken in conjunction with the accompanying drawings wherein like parts are denoted by like reference numerals.

BRIEF DESCRIPTION OF THE DRAWINGS

FIG. 1(a) is a plan view of a photoelectric converter already provided by our research group; FIG. 1(b) is a sectional view taken along the line A-A' thereof;

FIG. 2(a) is a schematic sectional view of an embodiment of the semiconductor device according to the present invention, and FIG. 2(b) is a sectional view taken along the line B-B' thereof;

FIG. 3 is a circuit diagram for explaining the operation of an embodiment of the semiconductor device according to the present invention;

FIGS. 4(a) to 4(m) are partial schematic sectional views for explaining a first embodiment of the production process according to the present invention;

FIGS. 8(a) to 8(o) and FIGS. 9(a) to 9(k) are partial sectional views for explaining fourth and fifth embodiments, respectively, of the production process according to the present invention.

DESCRIPTION OF THE PREFERRED EMBODIMENTS

Figure 4E:
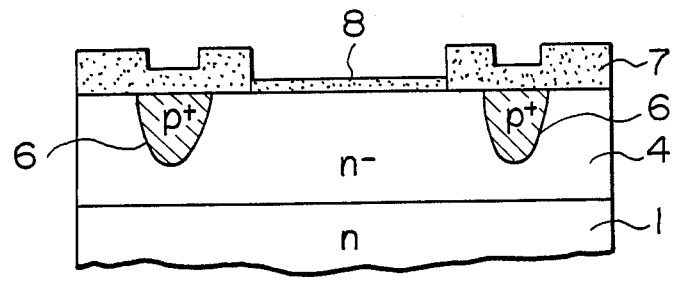

FIG. 2(a) is a plan view of a first embodiment of the semiconductor device according to the present invention and FIG. 2(a) is a sectional view taken along the line B-B' thereof. This embodiment constitutes a photoelectric converter wherein photosensor cells are arranged two-dimensionally.

Referred to FIGS. 2(a) and 2(b), on a substrate 1 of n-type silicon is formed an n⁻ epitaxial layer 4 in which photosensor cells are formed and electrically isolated from each other by p+ cell isolation regions 6.

Each photosensor cell is constituted by a p base region 9 and an n+ emitter region 15 of a bipolar transistor; a polysilicon electrode 14 formed by the medium of an oxide layer as a gate electrode of a p-MOS transistor and also as an electrode of a capacitor Cox for applying pulses to the p base region 9; a polysilicon electrode 13 connected to the n+ emitter region 15; an electrode 19 connected to the polysilicon 13; and an electrode 17 connected to the polysilicon 14, as main components, on the n⁻ epitaxial layer 4.

A photosensor cell having a structure as described above operates basically in the following manner.

First, in the charge storage operation, the p base region 9 is provided with a reverse bias potential with respect to the n+ emitter region 15, and then the polysilicon 14 is maintained at a positive potential which is higher than the threshold voltage of the p-MOS transistor so as to keep the p-MOS transistor in its OFF state, whereby photogenerated holes are stored or accumulated in the p base region 9.

As the holes are accumulated, the potential of the p base region 9 is changed in the positive direction, whereas the resultant potential varies depending on the intensity of the light incident on each photosensor cell.

Under this state, a positive readout pulse voltage $V_R$ is applied to the polysilicon 14 through the electrode 17. As the voltage $V_R$ is positive, the p-MOS transistor is kept turned off. When the readout pulse voltage $V_R$ is applied to the polysilicon 14, the p base region 9 is changed to a forward bias state relative to the n+ emitter region 15, whereby electrons are injected from the n+ emitter region 15 to the p base region 9 and the potential of the n+ emitter region 15 is gradually changed toward a positive potential. As a result, the light information stored in the p base region 9 is read out to the emitter 15.

When the polysilicon 14 is brought to the ground potential after a predetermined period of application of the readout pulse voltage $V_R$, the p base region 9 is reverse biased with respect to the n+ emitter region 15, whereby the change in potential of the n+ emitter region 15 is terminated. Under this state, the information is read out from the emitter through the polysilicon 13 and the electrode 19 to the exterior.

After the above mentioned readout operation, the electrode 19 is grounded, whereby the n+ emitter region 15 is brought to the ground potential. In this state, however, the potential corresponding to the light intensity, i.e., the light information, is still retained in the p base region 9 so that it is necessary to remove the light information.

For this purpose, a negative pulse voltage $V_{RH}$ exceeding the threshold voltage Vth of the p-MOS transistor is applied to the polysilicon 14 through the electrode 17. As a result, the p-MOS transistor is turned on, whereby the holes stored in the p base region 9 are removed and the potential of the p base region 9 is fixed at a predetermined negative voltage applied to the p+ cell isolation region 6.

By this refreshing operation, the p base region 9 is completely returned to the initial state. Thereafter, the above mentioned storage, readout and refreshing operations are repeated.

As a positive pulse is applied in the readout stage and a negative pulse is applied in the refreshing stage so as to turn on the p-MOS transistor, respectively, to the polysilicon 14, the above mentioned operations do not interfere with each other.

It should also be noted that, when strong light is incident on a part of the photoelectric converter wherein photosensor cells are arranged as shown in FIG. 3, the p base region 9 of a photosensor cell at that part of the converter is forward biased with respect to the n+ emitter region 15 so that a signal is read out to the emitter, i.e., a blooming phenomenon occurs.

In order to prevent this difficulty, the potential of the polysilicon 14 may be so set as to turn on the p-MOS transistor when the potential of the p base region 9 approaches zero, i.e., before a signal is read out to the emitter.

By setting the potential of the polysilicon 14 in this manner, the p-MOS transistor is turned on before the p base region 9 and the n+ emitter region 15 assume a forward bias state, so that excessive charge flows out to the p+ cell isolation region 6 and blooming is avoided.

FIG. 3 is a circuit diagram of this embodiment, wherein a number of picture elements of 2×2=4 is adopted for simplicity in illustration. However, it will be readily understood that a circuit with an arbitrary number of picture elements of n×n can be constituted in a similar manner.

Each of the photosensor cells $E_{11}$ to $E_{22}$ shown in FIG. 3 has a structure as explained with reference to FIGS. 2(a) and 2(b). Thus, a capacitor Cox 302 is constituted by the p base region 9 of a bipolar transistor 301 and the polysilicon 14 opposite thereto with the oxide film 10 therebetween. A p-MOS transistor 303 is constituted by the p base region 9, the p+ cell isolation region 6 and the polysilicon 14. In this embodiment, the polysilicon 14 constitutes one electrode of the capacitor Cox 302 and also the gate of the p-MOS transistor 303, whereas these can be separately formed as in a device shown in FIG. 1.

Electrodes 17 of photosensor cells $E_{11}$ and $E_{12}$, respectively, are connected to a first parallel output of a shift register A through a switching transistor (hereinafter abrreviated as "SWT") 304 and to a terminal $T_3$ through an SWT 305.

Electrodes 17 of photosensor cells $E_{21}$ and $E_{22}$, respectively, are connected to a second parallel output of the shift register A through an SWT 306 and to the terminal $T_3$ through an SWT 307.

Gates of SWTs 304 and 306, respectively, are connected to a terminal $T_1$, and gates of SWTs 305 and 307 are connected to a terminal $T_2$, respectively.

Emitter electrode 19 of bipolar transistors 301 of photosensor cells $E_{11}$ and $R_{21}$, respectively, are connected to an output terminal through an SWT 308 and grounded through an SWT 309.

Emitter electrodes 19 of photosensor cells $E_{12}$ and $E_{22}$, respectively, are connected to the output terminal through an SWT 310 and grounded through an SWT 311.

Further, gates of SWTs 308 and 310 are connected to first and second parallel terminals, respectively, of a shift register B, and gates of SWTs 309 and 311 are connected to a terminal $T_4$.

A predetermined negative voltage $V_{BB}$ is applied to the source region of the p-MOS transistor 303 of each photosensor cell, i.e., the p+ cell isolation region 6, while a predetermined positive voltage $V_{CC}$ is applied to the collector electrode 21 of the bipolar transistor 301 of each photosensor cell.

Further, a voltage is applied to terminals $T_1$ to $T_4$ at predetermined instants thereby to turn on the corresponding SWTs.

Shift pulses are input to the shift registers A and B at predetermined instants and a high level signal (positive voltage $V_R$) is output successively from the respective parallel output terminals.

The operation of the circuit of this embodiment having a structure as explained above will now be briefly described.

First, SWTs 304, 306, 308 and 310 are turned off, SWTs 305, 307, 309 and 311 are turned on, and a negative voltage pulse for refreshing is applied to the terminal $T_3$, whereby all the photosensor cells $E_{11}$ to $E_{22}$ are refreshed.

Then, SWTs 305 and 307 are turned off to effect the charge storage operation. As a result, light information varying part to part is stored at the respective p base regions 9.

Subsequently, SWTs 309 and 311 are turned off, SWTs 304 and 306 are turned on, and the stored bits of information are successively read out.

First, a first parallel output of the shift register A is made at a high level to apply a positive voltage $V_R$ to electrodes 17 of the photosensor cells $E_{11}$ and $E_{12}$, whereby bits of information stored at the p base regions 9 are read out to the emitters. Then, the first and second parallel outputs are successively made at a high level to successively turn on the SWTs 308 and 310. By this, the bits of information stored in the photosensor cells $E_{11}$ and $E_{12}$ are successively output to the exterior.

Then, the second parallel output of the shift register A is made high and the shift register B is operated in the above described manner, whereby the bits of information stored in the photosensor cells $E_{21}$ and $E_{22}$ are successively output to the exterior likewise.

After the readout operation is completed in this manner, the above mentioned refreshing operation is carried out. Thereafter, the storage, readout and refreshing operations are respectively repeated.

FIGS. 4(a) to 4(m) are schematic sectional views for explaining successive steps for production of the semiconductor device shown in FIGS. 2(a) and 2(b).

First, as shown in FIG. 4(a), an n+ layer 2 for ohmic contact with an impurity concentration of $1 \times 10^{17}$ to $1 \times 10^{20}$ cm$^{-3}$ is formed on the back side of an n type silicon substrate 1 with an impurity concentration of $1 \times 10^{15}$ to $5 \times 10^{17}$ cm$^{-3}$ by diffusion of P, As or Sb. Then, an oxide film (e.g., SiO$_2$ film) 3 is formed on the n+ layer 2 by a CVD process in a thickness of 3000 to 7000 Å.

The oxide film 3 is called a back coating and is provided for preventing generation of impurity vapor when the substrate 1 is heat-treated.

Then, the front surface of the substrate 1 is etched for about 1.5 min. under the conditions of a temperature of 1000° C. and the atmosphere of HCl at 2 l/min. and H$_2$ at 60 l/min. Then, on the surface is formed an n$^-$ epitaxial layer 4 with the use of a source gas of SiH$_2$Cl$_2$ (100%) flowing at a rate of 1.2 l/min. and a doping gas (H$_2$-diluted PH$_3$, 20 ppm) at a rate of 100 cc/min. under the conditions of a growth temperature of 1000° C. and a reduced pressure of 120 to 180 Torr. The single crystal growth rate of this time is 0.5 μm/min., the thickness is 2 to 10 μm, and the impurity concentration is $1 \times 10^{12}$ to $10^{16}$ cm$^{-3}$, preferably $10^{12}$ to $10^{14}$ cm$^{-3}$ (FIG. 4(b)).

In order to improve the quality of the n$^-$ layer 4, it is effective to heat the substrate to a high temperature of the order of 1150° to 1250° C. so that the oxygen in the vicinity of the surface is removed and thereafter to heat-treat the substrate for a long time at a temperature of the order of 800° C. so as to cause many microdefects, thereby to make the substrate one having denuded zones which can be subjected to the intrinsic gettering process.

Then, an oxide film 5 with a thickness of 4000 to 80,000 Å is formed on the n$^-$ layer 4 by pyrogenic oxidation with H$_2$+O$_2$, wet oxidation with O$_2$+H$_2$O or steam oxidation with N$_2$+H$_2$O. Further, in order to obtain a good quality of oxidation film free of lamination defects, etc., high pressure oxidation at 800° to 1000° C. is appropriate.

Then, parts of the oxide film 5 are selectively removed by a photolithography process in order to form the cell isolation regions (FIG. 4(c)).

Subsequently, a wafer of boron nitride (BN) is disposed so as to face the wafer shown in FIG. 4(c) in a diffusion furnace and heated at 800° C. in the atmosphere of $H_2+O_2+N_2$, thereby to form a boron glass layer ($SiO_2$ layer containing an impurity B) on the oxide film 5 and the n⁻ layer 4. Then the substrate is heat-treated at 1100° C. for 5 to 15 min. in a nitrogen atmosphere to diffuse the deposited impurity B in a small thickness.

Then, the boron glass which can cause non-uniform diffusion is removed by hydrofluoric acid $+HNO_3$.

Further, oxidation is carried out at 800° C. in the atmosphere of $H_2+O_2$ for 30 to 60 min. By this oxidation, the boron glass which has not been removed completely and microdefects which have been generated during the deposition of the impurity B, can be taken into the oxide film. The thus formed oxide film is removed by hydrofluoric acid to expose a clean and defect-free surface.

Then, driving-in of the impurity is effected at 950°–1050° C. in an atmosphere of $H_2+O_2$ for 30 to 50 min. to form a p+ cell isolation region 6 and an oxide film 7 (FIG. 4(d)).

In a particular example, the driving-in was effected for 60 min. to form a cell isolation region 6 with a sheet resistivity of 20 $\Omega/\square$ and a thickness of 1.7 $\mu m$.

Alternatively, the p+ cell isolation region 6 can be formed by forming the oxide film 5 as shown in FIG. 4(c), depositing thereon a layer of BSG (boron silicate glass; an $SiO_2$ film containing B as impurity) as a diffusion source by a CVD process and effecting driving-in, similarly as the diffusion process as described above.

After the p+ cell isolation region 6 has been formed, the oxide film 7 (including the oxide film 5) is selectively removed by etching and a buffer oxide film 8 is formed thereat in order to form a base region (See FIG. 4(e)). In this step, the back coating oxide film 3 is completely removed.

The oxide film 8 is formed in a thickness of 500 to 1500 Å for the purpose of preventing channeling and formation of surface defects during the formation of a p⁻ base region by ion injection.

Then, B+ ions or $BF_2^+$ ions are injected into the wafer with the use of $BF_3$ as a source gas. At this time, the oxide film 7 functions as a mask, whereby B+ ions are injected into a portion only below the oxide film 8. The surface concentration is $1\times10^{15}$ to $5\times10^{18}$ cm⁻³, preferably 1 to $20\times10^{16}$ cm⁻³, and the amount of ion injection is $7\times10^{11}$ to $1\times10^{15}$ cm⁻², preferably $1\times10^{12}$ to $1'10^{14}$ cm⁻².

Figure 4F:
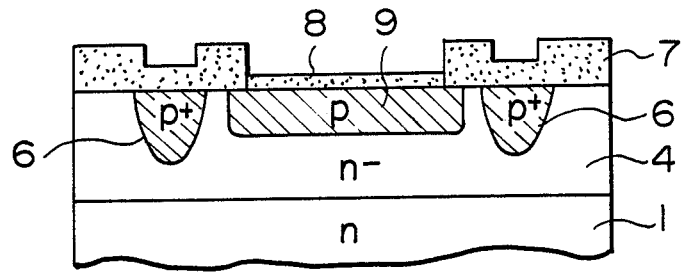

After the ions have been injected, heat diffusion is effected at 1000° to 1100° C. in an $N_2$ atmosphere to form the p base region 9 in a predetermined thickness (FIG. 4(f)). The thickness of the p base region 9 is, for example, of the order of 0.6 to 1 $\mu m$.

The thickness and the impurity concentration of the base region 9 are determined in consideration of the following factors. In order to increase the sensitivity, it is preferred that the impurity concentration of the base region 9 is decreased so that the capacitance Cbe between the base and emitter is reduced. The capacitance Cbe is roughly given by $$C_{be} = A\epsilon \left( \frac{q \cdot N_A}{2\epsilon \cdot V_{bi}} \right)^{\frac{1}{2}}$$

where
Vbi: the base-emitter diffusion voltage given by $$V_{bi} = \frac{kT}{q} \ln \frac{N_A \cdot N_D}{n_i^2}$$

$\epsilon$: the dielectric constant of silicon crystal;
$N_D$: the impurity concentration in the emitter;
$N_A$: the impurity concentration of the portion of the base adjacent to the emitter;
$n_i$: the intrinsic carrier concentration;
k: Boltzmann constant;
T: temperature; and
q: unit charge.

The lower $N_D$ is, the lower the capacitance Cbe becomes so that the sensitivity is increased. However, when the impurity concentration $N_A$ is made too low, the base region is completely depleted during operation so that punching-through occurs. Therefore, the impurity concentration $N_A$ cannot be made too low. That is, the impurity concentration $N_A$ is so determined that the base region will not be completely depleted and no punching-through will occur.

Incidentally, the base region 9 may also be formed by depositing BSG on the wafer and diffusing the impurity B into a predetermined thickness by thermal diffusion at 1100°–1200° C.

Figure 4G:
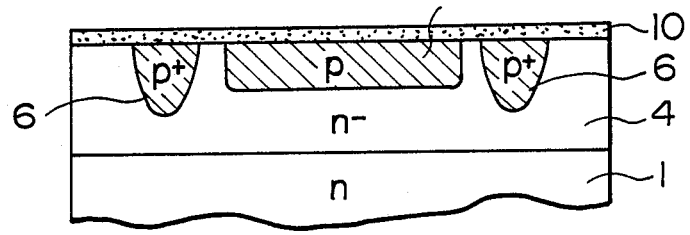
Figure 4H:
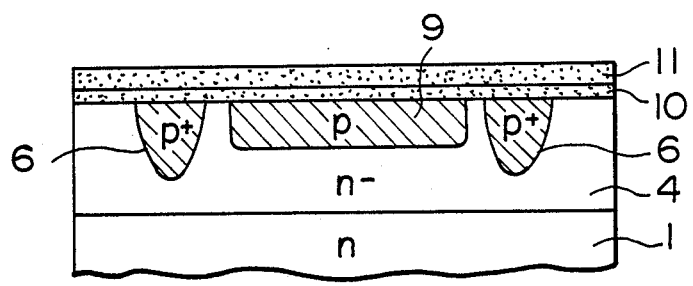
Figure 4I:
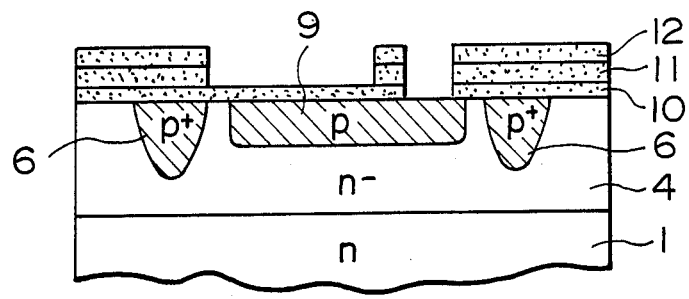

After the cell isolation region 6 and the base region 9 have thus been formed, the oxide films 7 and 8 are removed, and an oxide film 10 is formed in a thickness of several tens to several hundreds of angstroms (Å) (FIG. 4(g)).

Instead of the oxide film 10, a nitride film ($Si_3N_4$) may also be used. A nitride film has a dielectric constant about two times as large as that of an $SiO_2$ film and can provide a larger capacitance. On the other hand, an oxide film ($SiO_2$ film) is advantageous in that it provides a small heat stress and a low surface state due to stable interface between Si and $SiO_2$.

After the oxide film 10 has been formed, B+ ions are injected at a rate of $5\times10^{10}$ to $1\times10^{13}$ cm⁻². The ion injection is effected in order to set the threshold voltage Vth of the p-channel MOS transistor formed between the base region 9 and the cell isolation region 6 at an appropriate level. In this embodiment, the threshold voltage has been set at 0.5 to 2 V.

Then, a nitride film 11 ($Si_3N_4$) is formed in a thickness of 500 to 1500 Å on the oxide film 10 at a temperature of 700° to 900° C. (FIG. 4(h)).

A PSG film 12 is further formed on the nitride film 11. Then, by applying a photolithography process including two mask alignment steps, all of the oxide film 10, nitride film 11 and PSG film 12 are removed at a portion where an emitter is formed, while the nitride film 11 and PSG film 12 are removed by etching to leave the oxide film 10 at a portion where an electrode functioning as the gate of the p-channel MOS transistor and also as an electrode of the capacitor Cox is formed FIG. 4(i)).

Then, an As-doped polysilicon layer is deposited by a CVD process using a mixture gas of $N_2+SiH_4+AsH_3$ or $H_2+SiH_4+AsH_3$. The polysilicon layer is deposited at about 550° C. to 900° C. in a thickness of 2000 to 7000 Å. Instead, non-doped polysilicon may be deposited by a CVD process, followed by diffusion of As or P.

Figure 4J:
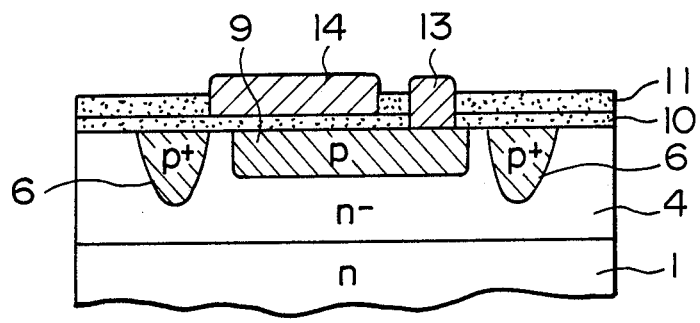

Then, a part of the deposited polysilicon film is selectively removed by a photolithography process including a mask alignment step and an etching step, and the polysilicon formed on the PSG film 12 is further removed in a self alignment manner utilizing lifting-off by etching the PSG film 12, whereby polysilicon electrodes 13 and 14 are formed (FIG. 4(j)). Herein, the etching of the deposited polysilicon is effected by using a gaseous system of $C_2Cl_2F_4$, $CBrF_3+Cl_2$, etc., while the etching of the PSG film 12 by a gas of $CH_2F_2$, etc.

Figure 4K:
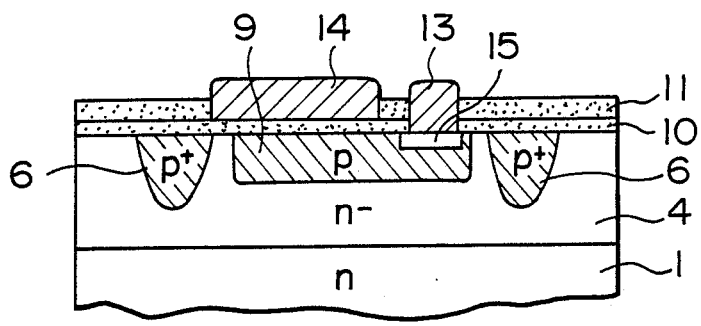
Figure 4L:
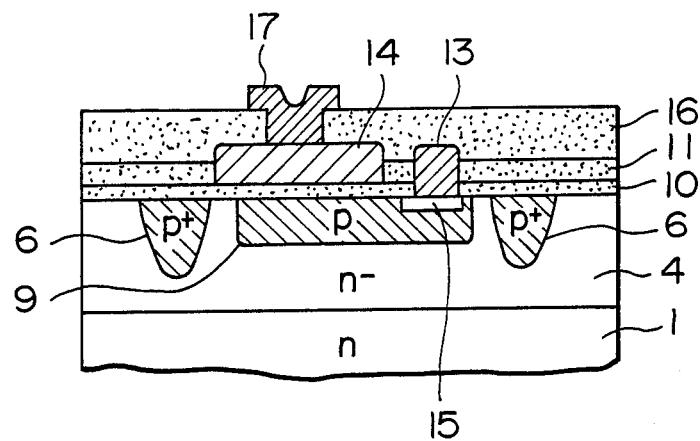
Figure 4M:
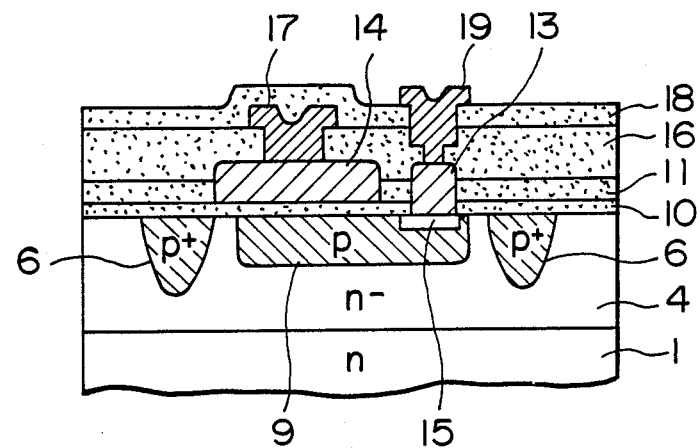

Thereafter, the impurity (As) is diffused from the polysilicon 13 into the base region 9 by heating, thereby to form an n+ emitter region 15 (FIG. 4(k)).

Then, a PSG film 16 is formed in a thickness of 3000 to 7000 Å by a CVD process using the above described gaseous system, followed by a lithography process including a mask alignment step and an etching step to form a contact hole above the polysilicon 14. In the contact hole, an electrode 17 of a metal such as Al, Al-Si, Al-Cu-Si, etc., is deposited by vacuum evaporation or sputtering (FIG. 4(l)).

Further, an inter-layer insulating film 18 of a PSG film, $SiO_2$ film, etc., is formed in a thickness of 3000 to 6000 Å by a CVD process and a contact hole is formed therethrough over the polysilicon 13 through mask alignment and etching steps. A metal electrode 19 of Al, Al-Si, Al-Cu-Si etc., is further formed in the contact hole (FIG. 4(m)).

Finally, a passivation film 20 of PSG, $Si_3N_4$, etc., is formed by a CVD process and a metal electrode 21 of Al, Al-Si, Au, etc., on the back surface of the wafter, whereby a structure as shown in FIGS. 2(a) and 2(b) is completed.

Figure 5H:
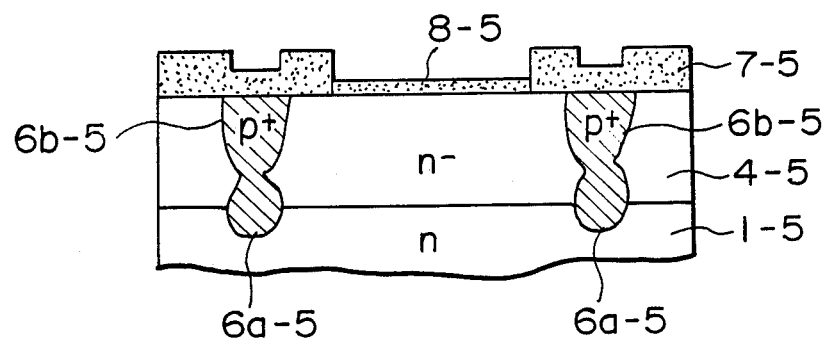
FIGS. 5(a) to 5(q) are partial schematic sectional views for explaining a second embodiment of the production process according to the present invention.
Figure 5I:
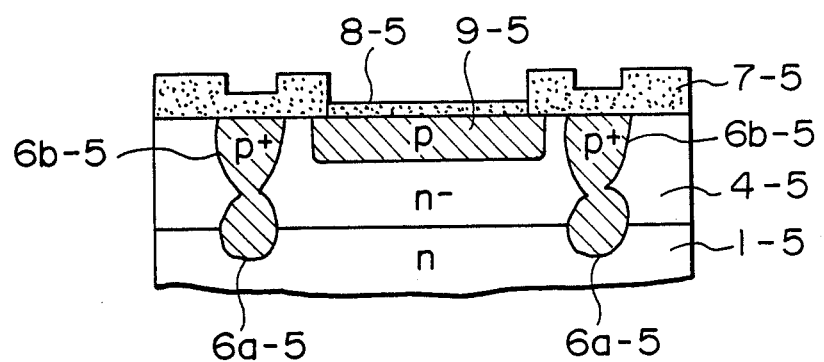
Figure 5J:
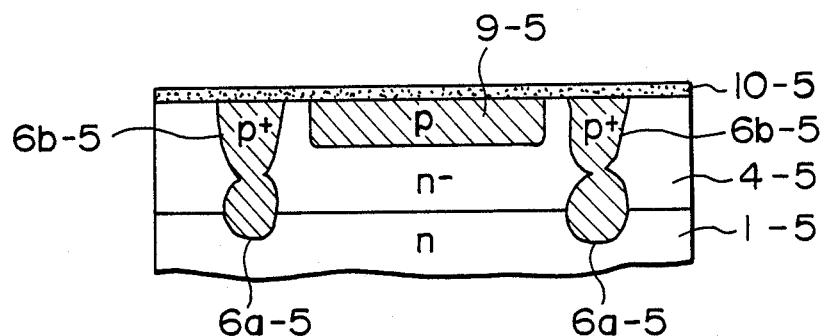
Figure 5K:
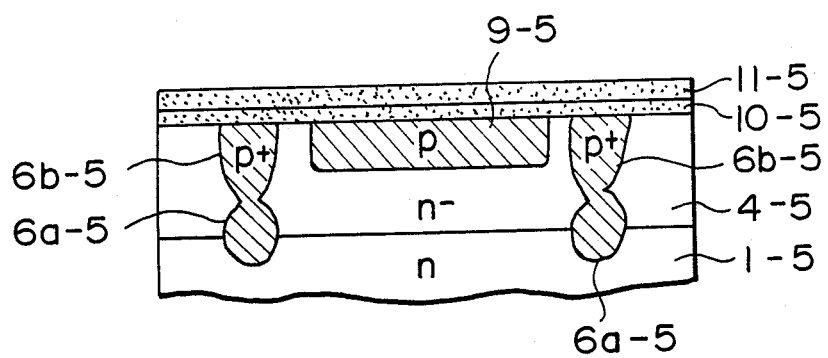
Figure 5L:
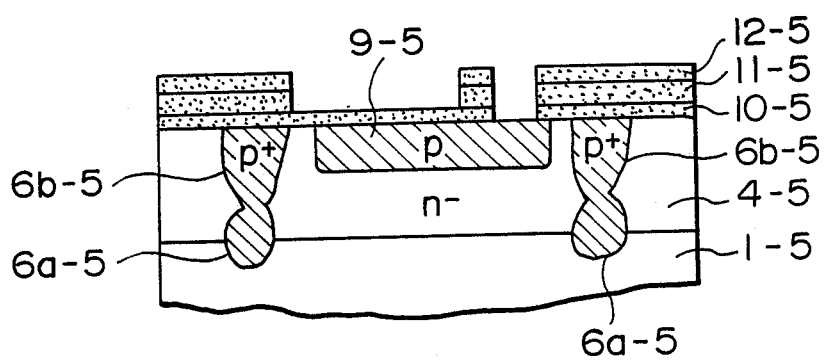
Figure 5M:
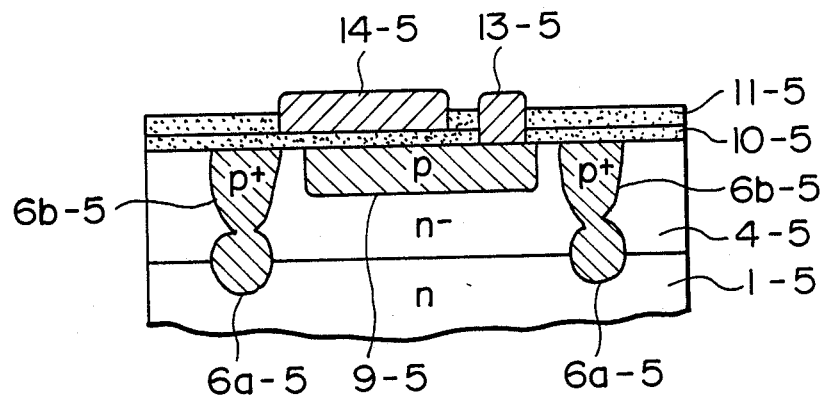
Figure 5N:
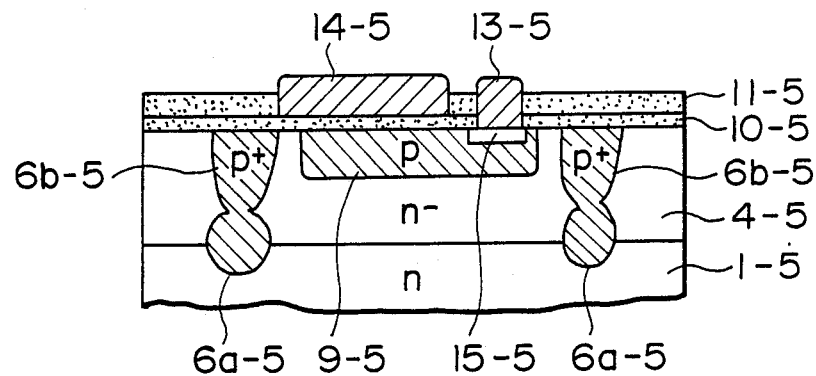
Figure 5O:
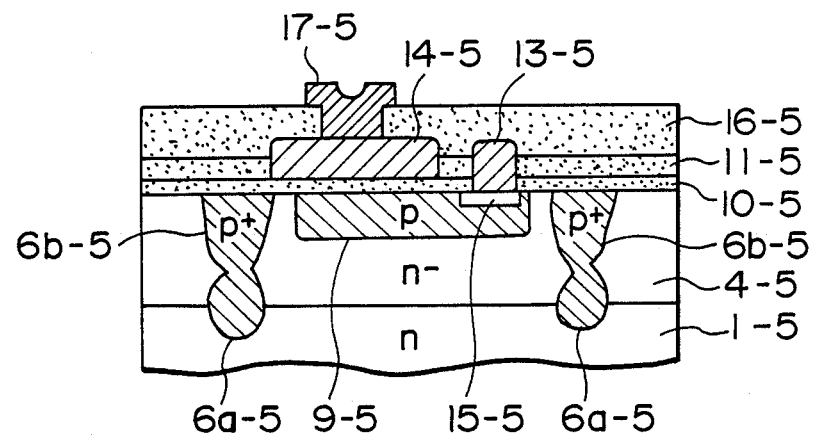
Figure 5P:
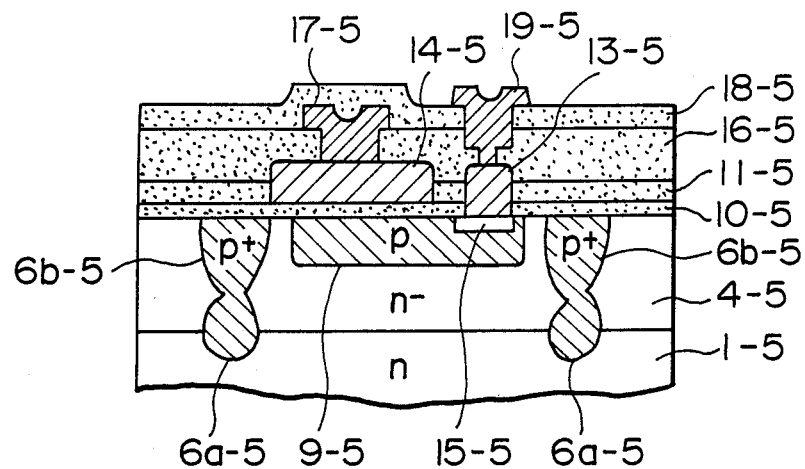
Figure 5Q:
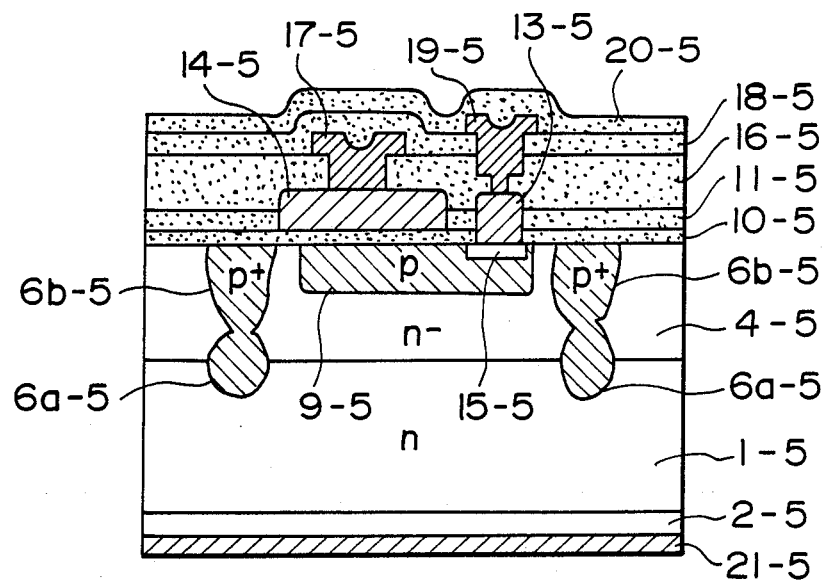

FIGS. 5(a) to 5(q) are sectional views showing another embodiment of the process for producing the semiconductor device according to the present invention, wherein a photoelectric converter is taken as an example.

First, as shown in FIG. 5(a), an n+ layer 2-5 for ohmic contact with an impurity concentration of $1\times10^{17}$ to $5\times10^{20}$ cm$^{-3}$ is formed on the back side of an n type silicon substrate 1-5 with an impurity concentration of $1\times10^{15}$ to $5\times10^{17}$ cm$^{-3}$, preferably of $1\times10^{16}$ to $1\times10^{17}$ cm$^{-3}$, by diffusion of P, As or Sb. Then, oxide films $a_1$-5 are formed on the substrate 1-5 and the n+ layer 2-5, respectively, in a thickness of 500 to 1500 Å.

Then, a resist layer $a_2$-5 is applied on the oxide film $a_1$-5 on the substrate 1-5 and is patterned (FIG. 5(b)).

Then, with the use of the patterned resist $a_2$-5 as a mask, B+ ions are injected at a rate of $1\times10^{13}$ to $1\times10^{15}$ cm$^{-2}$. After the ion injection, the resist $a_2$-5 is removed by a mixture of $H_2SO_4$ and $H_2O_2$ and then a heat treatment is effected at 1000° C. to 1100° C. for 1 to 2 hours. By this heat treatment, the boron injected in the vicinity of the surface of the substrate 1-5 is driven in by heat diffusion to form a p+ region $a_3$-5 (FIG. 5(c)).

The oxide films $a_1$-5 formed on both sides are removed, and an oxide film 3:5 is formed on the n+ layer 2-5 in a thickness of 3000 to 7000 Å by a CVD process (FIG. 5(d)).

The oxide film 3-5 is called a back coating and is provided for preventing generation of impurity vapor when the substrate 1-5 is heat-treated.

Then, the front surface of the substrate 1-5 is etched for about 1.5 min. under the conditions of a temperature of 1000° C. and the atmosphere of HCl at 2 l/min. and $H_2$ at 60 l/min. Then, on the surface is formed an n− epitaxial layer 4-5 with the use of a source gas of $SiH_2Cl_2$ (100%) flowing at a rate of 1.2 l/min. and a doping gas ($H_2$-diluted $PH_2$, 20 ppm) at a rate of 100 cc/min. under the conditions of a growth temperature of 1000° C. and a reduced pressure of 120 to 180 Torr. The single crystal growth rate at this time is 0.5 μm/min., the thickness is 2 to 10 μm, and the impurity concentration is $1\times10^{12}$ to $10^{16}$ cm$^{-3}$, preferably $10^{12}$ to $10^{14}$ cm$^{-3}$.

When the n− layer 4-5 is grown, the impurity (B) is diffused from the p+ region $a_3$-5 to the growing n− layer 4-5 to form a p+ region $6a$-5 (FIG. 5(e)).

The reduced-pressure epitaxial growth process as described above is carried out in a reaction furnace in which a reduced pressure of 80 to 200 Torr is formed by a rotary pump, etc., and is effective for producing a high-quality epitaxial growth layer of a high resistivity and little autodoping from the substrate.

In order to improve the quality of the n− layer 4-5, it is effective to heat the substrate to a high temperature of the order of 1150° to 1250° C. so that the oxygen in the vicinity of the surface is removed and thereafter to heat-treat the substrate for a long time at a temperature of the order of 800° C. so as to cause many microdefects, thereby to make the substrate one having denuded zones which can be subjected to the intrinsic gettering process.

Then, an oxide film 5-5 with a thickness of 4000 Pto 80,000 Å is formed on the n− layer 4-5 by pyrogenic oxidation with $H_2+O_2$, wet oxidation with $O_2+H_2O$ or steam oxidation with $N_2+H_2O$. Further, in order to obtain a good quality of oxidation film face of lamination defects, etc., high pressure oxidation at 800° to 1000° C. is appropriate.

Then, parts of the oxide film 5-5 are selectively removed by a photolithographic technique in order to form the cell isolation regions (FIG. 5(f)).

Subsequently, a wafer of boron nitride (BN) is disposed so as to face the wafer shown in FIG. 5(f) in a diffusion furnace and heated at 800° C. in the atmosphere of $H_2+O_2+N_2$, thereby to deposite a boron glass layer containing an impurity B on the oxide film 5-5 and the n− layer 4-5. Then the substrate is heat-treated at 1100° C. for 5 to 15 min. in a nitrogen atmosphere to diffuse the deposited impurity B in a small thickness.

Then, the boron glass which can cause non-uniform diffusion is removed by hydrofluoric acid $+HNO_3$.

Further, oxidation is carried out at 800° C. in the atmosphere of $H_2+O_2$ for 30 to 60 min. By this oxidation, the boron glass which has not been removed completely and microdefects which have been generated during the deposition of the impurity B, can be taken into the oxide film. The thus formed oxide film is removed by hydrofluoric acid to expose a clean and defect-free surface.

Then, driving-in of the impurity is effected at 900°-1000° C. in an atmosphere of $H_2+O_2$ for 30 to 50 min. to form a p+ cell isolation region $6b$-5 and an oxide film 7-5 (FIG. 5(g)).

Thus, the p+ regions $6a$-5 and $6b$-5 connects with each other to form a p+ cell isolation region 6-5 ($6a$-5 $+6b$-5).

Alternatively, the p+ cell isolation region 6a-5 can be formed by forming the oxide film 5-5 as shown in FIG. 5(f), depositing thereon a layer of BSG (boron silicate glass; an SiO$_2$ film containing B as impurity) as a diffusion source by a CVD process and effecting driving-in, similarly as the diffusion process as described above.

After the p+ cell isolation region 6-5 has been formed, the oxide film 7-5 (including the oxide film 5-5) is selectively removed by etching and a buffer oxide film 8-5 is formed thereat in order to form a base region (see FIG. 5(h)). In this step, the back coating oxide film 3-5 is completely removed.

The oxide film 8-5 is formed in a thickness of 500 to 1500 Å for the purpose of preventing channeling and formation of surface defects during the formation of a p base region by ion injection.

Then, B+ ions or BF$_2$+ ions are injected into the wafer with the use of BF$_3$ as a source gas. At this time, the oxide film 7-5 functions as a mask, whereby B+ ions are injected into a portion only below the oxide film 8-5. The surface concentration is $1\times10$ to $5\times10^{18}$ cm$^{-3}$, preferably 1 to $20\times10^{16}$ cm$^{-3}$, and the amount of ion injection is $7\times10^{11}$ to $1\times10^{15}$ cm$^{-2}$, preferably $1\times10^{12}$ to $1\times10^{14}$ cm$^{-2}$.

After the ions have been injected, heat diffusion is effected at 1000° to 1100° C. in an N$_2$ atmosphere to form a p base region 9-5 in a predetermined thickness (FIG. 5(i)). The thickness of the p base region 9-5 is, for example, of the order of 0.6 to 1 μm.

The thickness and the impurity concentration of the base region 9-5 are determined in consideration of the factors as explained with reference to FIG. 4.

Incidentally, the base region 9 may also be formed by depositing BSG on the wafer and diffusing impurity B into a predetermined thickness by thermal diffusion at 1100° to 1200° C.

The BSG deposition is carried out at a temperature of 350° to 450° C. with the use of a gaseous system B$_2$H$_6$+SiH$_4$+O$_2$, whereby a BSG film containing boron at a concentration of $1\times10^{21}$ to $5\times10^{21}$ cm$^{-3}$.

After the p+ cell isolation region 6-5 and the base region 9-5 have thus been formed, the oxide films 7-5 and 8-5 are removed, and an oxide film 10-5 is formed in a thickness of several tens to several hundreds of angstroms (Å) (FIG. 5(j)).

Instead of the oxide film 10-5, a nitride film (Si$_3$N$_4$) may also be used. A nitride film has a dielectric constant about two times as large as that of an SiO$_2$ film and can provide a larger capacitance. On the other hand, an oxide film (SiO$_2$ film) is advantageous in that it provides a small heat stress and a low surface state due to stable interface between Si and SiO$_2$.

After the oxide film 10-5 has been formed, p+ ions are injected at a rate of $5\times10^{10}$ to $1\times10^{13}$ cm$^{-2}$. The ion injection is effected in order to set the threshold voltage Vth of the p-channel MOS transistor formed between the base region 9-5 and the cell isolation region 6-5 at an appropriate level. In this embodiment, the threshold voltage has been set at 0.5 to 2 V.

Then, a nitride film 11-5 (Si$_3$N$_4$) is formed in a thickness of 500 to 1500 Å on the oxide film 10-5 at a temperature of 700° to 900° C. (FIG. 5(k)).

A PSG film 12-5 is further formed on the nitride film 11-5. Then, by applying a photolithography process including two mask alignment steps, all of the oxide film 10-5, nitride film 11-5 and PSG film 12-5 are removed at a portion where an emitter is formed, while the nitride film 11-5 and PSG film 12-5 are removed by etching to leave the oxide film 10-5 at a portion where an electrode functioning as the gate of the p-channel MOS transistor and also as an electrode of the capacitor Cox is formed (FIG. 5(l)).

Then, an As-dopsed polysilicon layer is deposited by a CVD process using a mixture gas of N$_2$+SiH$_4$+AsH$_3$ or H$_2$+SiH$_4$+AsH$_3$. The polysilicon layer is deposited at about 550° C. to 900° C. in a thickness of 2000 to 7000 Å. Instead, non-doped polysilicon may be deposited by a CVD process, followed by diffusion of As or P.

Then, a part of the deposited polysilicon film is selectively removed by a photolithography process including a mask alignment step and an etching step, and the polysilicon formed on the PSG film 12-5 is further removed in a self alignment manner utilizing lifting-off by etching the PSG film 12-5, whereby polysilicon electrodes 13-5 and 14-5 are formed (FIG. 5(m)). Herein, the etching of the deposited polysilicon is effected by using a gaseous system of C$_2$Cl$_2$F$_4$, CBrF$_3$+Cl$_2$, etc., while the etching of the PSG film 12-5 by a gas of CH$_2$F$_2$, etc.

Thereafter, the impurity (As) is diffused from the polysilicon 13-5 into the base region 9-5 by heating, thereby to form an n+ emitter region 15-5 (FIG. 5(n)).

Then, a PSG film 16-5 is formed in a thickness of 3000 to 7000 Å by a CVD process using the above described gaseous system, followed by a lithography process including a mask alignment step and an etching step to form a contact hole above the polysilicon 14-5. In the contact hole, an electrode 17-5 of a metal such as Al, Al-Si, Al-Cu-Si, etc., is deposited by vacuum evaporation or sputtering (FIG. 5(o)).

Further, an inter-layer insulating film 18-5 of a PSG film, SiO$_2$ film, etc., is formed in a thickness of 3000 to 6000 Å by a CVD process and a contact hole is formed therethrough over the polysilicon 13-5 through mask alignment and etching steps. A metal electrode 19-5 of Al, Al-Si, Al-Cu-Si etc., is further formed in the contact hole (FIG. 5(p)).

Finally, a passivation film 20-5 of PSG, Si$_3$N$_4$, etc., is formed by a CVD process and a metal electrode 21-5 of Al, Al-Si, Au, etc., on the back surface of the wafer, whereby a structure as shown in FIG. 5(q) is completed.

FIGS. 6(a) to 6(d) are sectional views showing an embodiment different from one explained with reference to FIG. 5 of the process for producing the semiconductor device according to the present invention.

Under the same conditions as those of producing the n$^-$ epitaxial layer in the step of FIG. 5(e), an n$^-$ epitaxial layer 4-5 is formed by epitaxial growth in a thickness of 1 to 5 μm. At this time, a p+ region 6a-5 is formed.

Figure 6A:
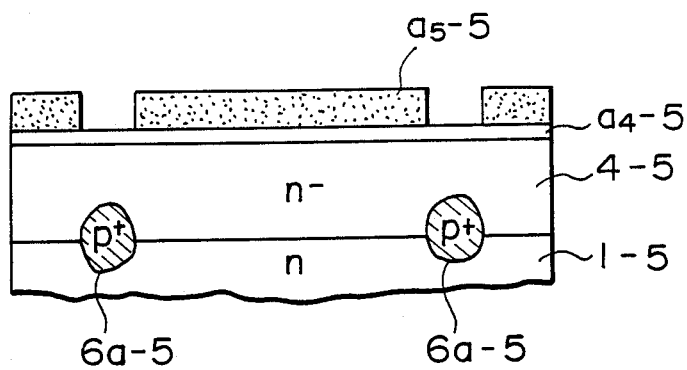
FIGS. 6(a) to 6(d) are partial schematic sectional views for explaining a third embodiment of the production process according to the present invention.
Figure 6B:
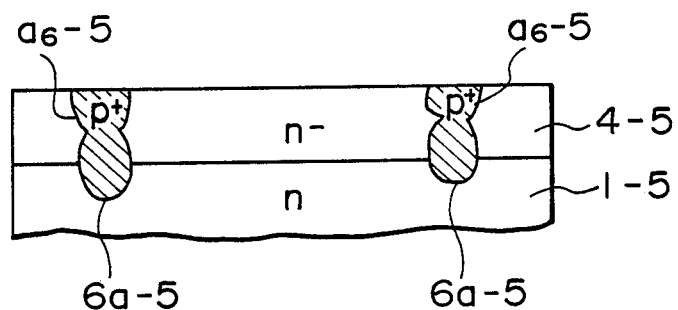

Then, on the n$^-$ layer 4-5 is formed an oxide film a$_4$-5 in a thickness of 500 to 1500 Å, on which a resist is applied and formed into a patterned resist a$_5$-5 (FIG. 6(a)).

Then, with the use of the patterned resist a$_5$-5 as a mask, B+ ions are injected at a rate of $1\times10^{12}$ to $1\times10^-$cm$^{-2}$. After the ion injection, the resist a$_5$-5 by a mixture of H$_2$SO$_4$ and H$_2$O$_2$ and then a heat treatment is effected at 1000° C. to 1100° C. for 1 to 2 hours. By this heat treatment, the boron injected in the vicinity of the surface of the n$^-$ layer 4-5 is driven in by heat diffusion to form a p+ region a$_6$-5, which is connected with the p+ region 6a-5. Then, the oxide film a$_4$-5 is removed (FIG. 6(b)).

Then, an oxide film having a thickness of 3000 to 7000 Å is formed as a back coating by a CVD process on the n+ layer 2-5 on the back side of the wafer.

Figure 6C:
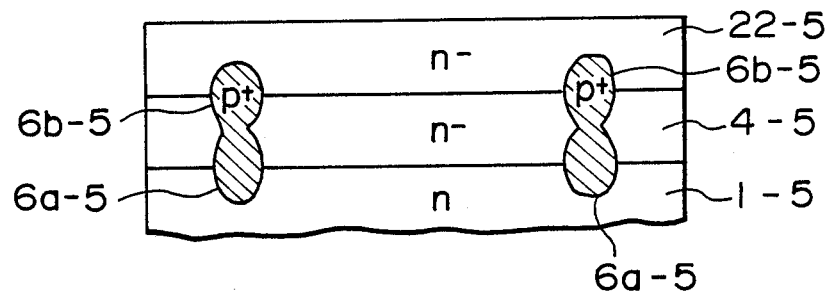

Then, on the n− layer 4-5 is formed an n− layer 22-5 by epitaxial growth under the same conditions to form a p+ region 6b-5 (FIG. 6(c)). The thickness of the n− layer 22-5 is 1 to 5 μm, and the impurity concentration is the same as that of tne n− layer 4-5.

Then, in the same manner as explained with reference to FIG. 6(a), a p+ region 6c-5 is formed and connected with the p+ regions 6a-5 and 6b-5 to form a p+ cell isolation region 6-5.

Figure 6D:
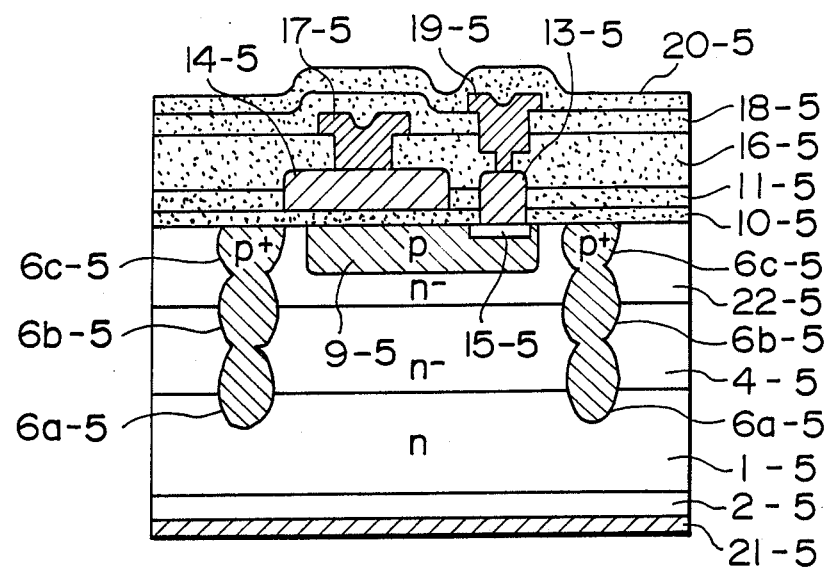

Thereafter, through the steps explained with reference to FIGS. 5(g) to 5(q), a photoelectric converter as shown in FIG. 6(d) is completed.

Figure 7:
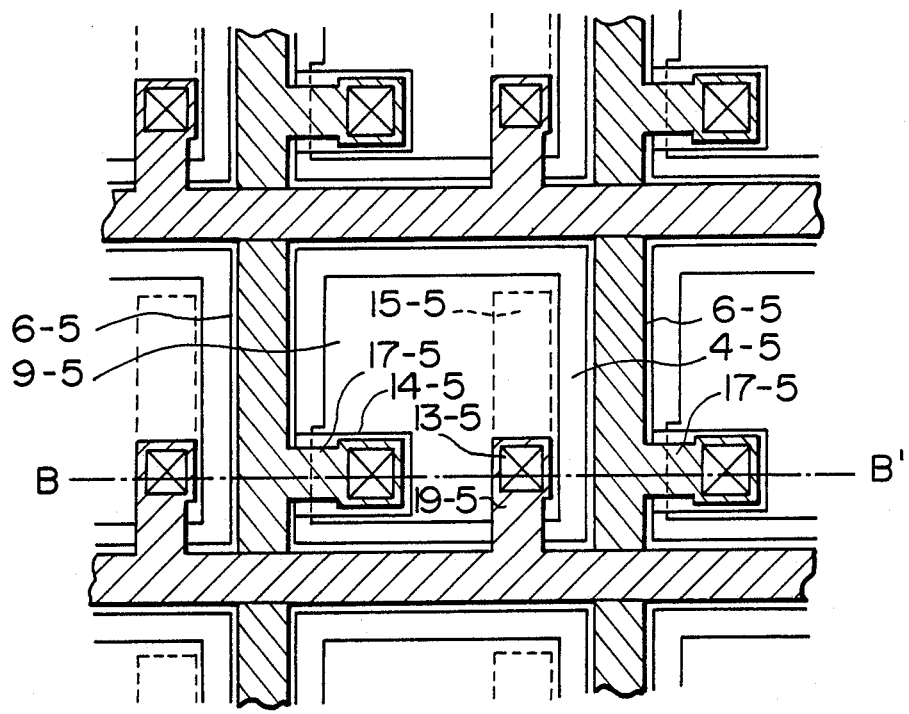
FIG. 7 is a top plan view of a semiconductor device shown in FIG. 5(q) or FIG. 6(d)

FIG. 7 is a plan view of a photoelectric converter wherein a photosensor cell as shown in FIG. 5(q) and FIG. 6(d) is arranged two-dimensionally.

The structure and operation of the embodiment shown in FIGS. 5(q) and 7 will now be explained with reference to these figures.

Referring to FIGS. 5(q) and 7, on a substrate 1-5 of n-type silicon is formed an n− epitaxial layer 4-5 in which photosensor cells are formed and electrically isolated from each other by p+ cell isolation regions 6-5 (combination of 6a-5 and 6b-5 in this embodiment).

Each photosensor cell is constituted by a p base region 9-5 and an n+ emitter region 15-5 of a bipolar transistor; a polysilicon electrode 14-5 formed by the medium of an oxide layer as a gate electrode of a p-MOS transistor and also as an electrode of a capacitor Cox for applying pulses to the p base region 9-5; a polysilicon electrode 13-5 connected to the n+ emitter region 15-5; an electrode 19-5 connected to the polysilicon 13-5; and an electrode 17-5 connected to the polysilicon 14-5, as main components, on the n− epitaxial layer 4-5.

A photosensor cell having a structure as described above operates basically in the following manner.

First, in the charge storage operation, the p base region 9-5 is provided with a reverse bias potential with respect to the n+ emitter region 15-5, and then the polysilicon 14-5 is maintained at a positive potential which is higher than the threshold voltage of the p-MOS transistor so as to keep the p-MOS transistor at its OFF state, whereby photogenerated holes are stored in the p base region 9-5.

As the holes are accumulated, the potential of the p base region 9-5 is changed in the positive direction, whereas the resultant potential in the p base region 9-5 varies depending on the intensity of the light incident on each photosensor cell.

Under this state, a positive readout pulse voltage $V_R$ is applied to the polysilicon 14-5 through the electrode 17-5. As the voltage $V_R$ is positive, the p-MOS transistor is kept in its OFF state. When the readout pulse voltage $V_R$ is applied to the polysilicon 14-5, the p base region 9-5 is changed to a forward bias state relative to the n+ emitter region 15-5, whereby electrons are injected from the n+ emitter region 15-5 to the p base region 9-5 and the potential of the n+ emitter region 15-5 is gradually changed toward a positive potential. As a result, the light information stored in the p base region 9-5 is read out to the emitter 15-5.

When the polysilicon 14-5 is brought to the ground potential after a predetermined period of application of the readout pulse voltage $V_R$, the p base region 9-5 is reverse biased with respect to the n+ emitter region 15-5, whereby the change in potential of the n+ emitter region 15-5 is terminated. Under this state, the information is read out from the emitter through the polysilicon 13-5 and the electrode 19-5 to the exterior.

After the above mentioned readout operation, the electrode 19-5 is grounded, whereby the n+ emitter region 15-5 is brought to the ground potential. In this state, however, the potential corresponding to the light intensity, i.e., the light information, is still retained in the p base region 9-5 so that it is necessary to remove the light information.

For this purpose, a negative pulse voltage $V_{RH}$ exceeding the threshold voltage Vth of the p-MOS transistor is applied to the polysilicon 14-5 through the electrode 17-5. As a result, the p-MOS transistor is turned on, whereby the holes stored in the p base region 9-5 are removed and the potential of the p base region 9-5 is fixed at a predetermined negative voltage applied to the p+ cell isolation region 6-5.

By this refreshing operation, the p base region 9-5 is completely returned to the initial state. Thereafter, the above mentioned storage readout and refreshing operations are repeated.

As a positive pulse is applied in the readout stage and a negative pulse is applied in the refreshing stage so as to turn on the p-MOS transistor, respectively, to the polysilicon 14-5, the above mentioned operations do not interfer with each other.

Incidentally, when strong light is incident on a part of the photoelectric converter wherein photosensor cells are arranged as shown in FIG. 7, the p bsse region 9-5 of a photosensor cell at the part is forward biased with respect to the n+ emitter region 15-5 so that a signal is read out to the emitter, i.e., a blooming phenomenon occurs.

In order to prevent this difficulty, the potential of the polysilicon 14-5 may be so set as to turn on the p-MOS transistor when the potential of the p base region 9-5 approaches to zero, i.e., before a signal is read out to the emitter side.

By setting the potential of the polysilicon 14-5 in this manner, the p-MOS transistor is turned on before the p base region 9-5 and the n+ emitter region 15-5 assume a forward bias state, so that excessive charge flows out to the p+ cell isolation region 6-5 and blooming is avoided.

A photoelectric converter with 2×2=4 picture elements, for example, may be constituted by arranging the photosensor cells shown in FIG. 5(q) or FIG. 6(d). The circuit diagram may be similar to one shown in FIG. 3.

Figure 8H:
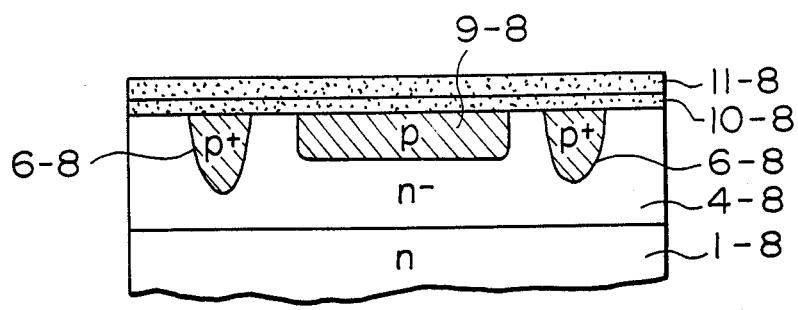
Figure 8I:
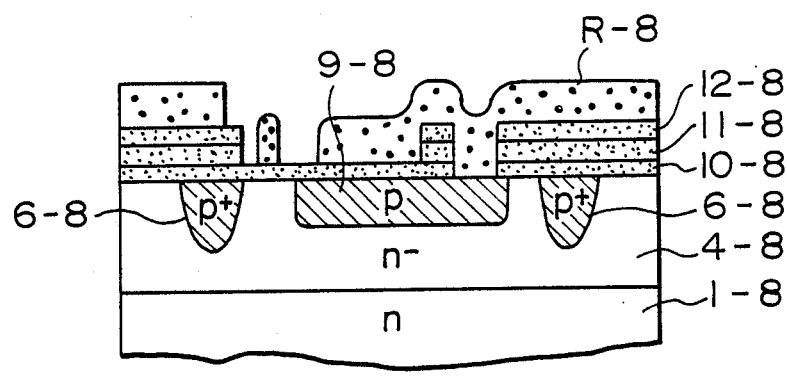
Figure 8J:
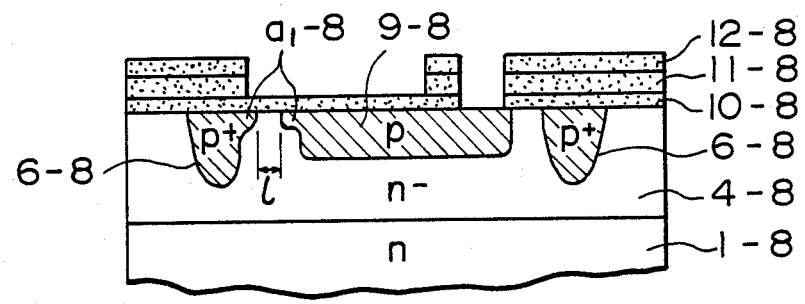
Figure 8N:
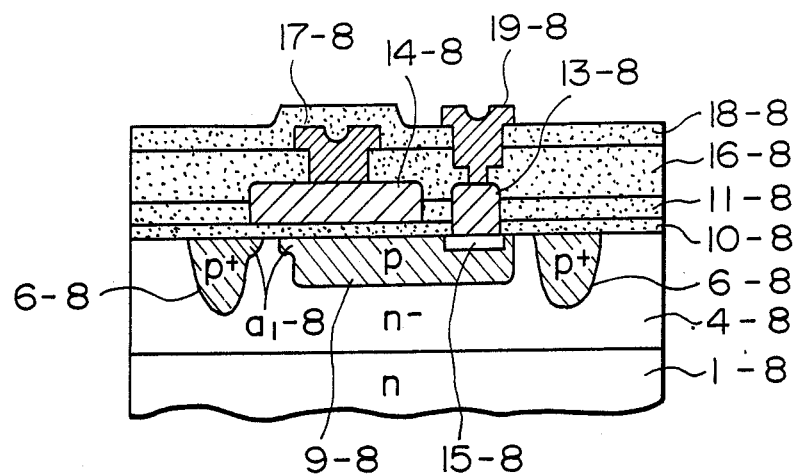
Figure 8O:
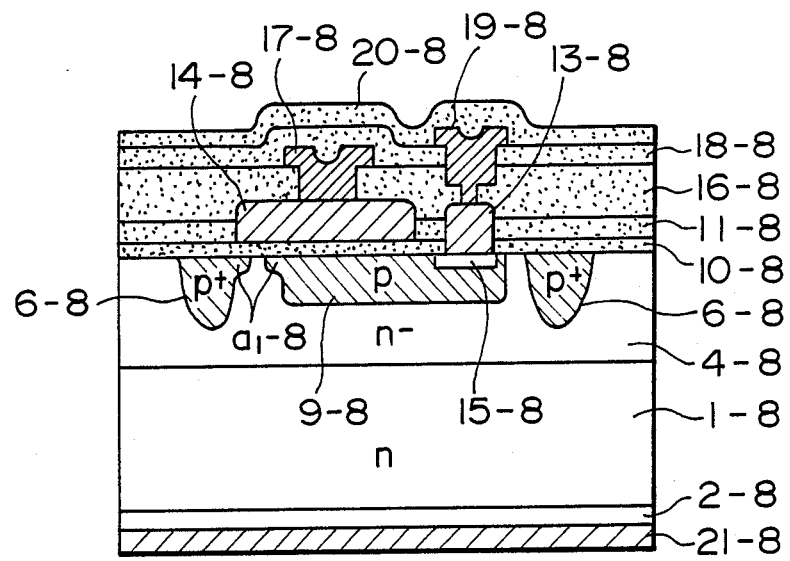

FIGS. 8(a) to 8(o) are sectional views showing a fourth embodiment of the process for producing the semiconductor device according to the present invention, wherein the production of a photoelectric converter is again taken as an example.

First, as shown in FIG. 8(a), an n+ layer 2-8 for ohmic contact with an impurity concentration of $1 \times 10^{17}$ to $1 \times 10^{20}$ cm$^{-3}$ is formed on the back side of an n type silicon substrate 1-8 with an impurity concentration of $1 \times 10^{15}$ to $5 \times 10^{17}$ cm$^{-3}$ by diffusion of P, As or Sb. Then, an oxide film 3-8 (e.g., SiO$_2$ film) is formed on the n+ layer 2-8 by a CVD process in a thickness of 3000 to 7000 Å.

The oxide film 3-8 is called a back coating and is provided for preventing generation of impurity vapor when the substrate 1-8 is heat-treated.

Then, the front surface of the substrate 1-8 is etched for about 1.5 min. under the conditions of a temperature of 1000° C. and the atmosphere of HCl at 2 l/min. and $H_2$ at 60 l/min. Then, on the surface is formed an n⁻ epitaxial layer 4-8 with the use of a source gas of $SiH_2Cl_2$ (100%) flowing at a rate of 1.2 l/min. and a doping gas ($H_2$-diluted $PH_3$, 20 ppm) at a rate of 100 cc/min. under the conditions of a growth temperature of 1000° C. and a reduced pressure of 120 to 180 Torr. The single crystal growth rate at this time is 0.5 μm/min., the thickness is 2 to 10 μm, and the impurity concentration is $1 \times 10$ to $10^{16}$ cm⁻³, preferably $10^{12}$ to $10^{14}$ cm⁻³ (FIG. 8(b)).

In order to improve the quality of the n⁻ layer 4-8, it is effective to heat the substrate to a high temperature of the order of 1150° to 1250° C. so that the oxygen in the vicinity of the surface is removed and thereafter to heat-treat the substrate for a long time at a temperature of the order of 800° C. so as to cause many microdefects, thereby to make the substrate one having denuded zones which can be subjected to the intrinsic gettering process.

Then, an oxide film 5-8 with a thickness of 4000 to 80,000 Å is formed on the n⁻ layer 4-8 by pyrogenic oxidation with $H_2+O_2$, wet oxidation with $O_2+H_2O$ or steam oxidation with $N_2+H_2O$. Further, in order to obtain a good quality of oxidation film free of lamination defects, etc., high pressure oxidation at 800° to 1000° C. is appropriate.

Then, parts of the oxide film 5-8 are selectively removed by a photolithographic technique in order to form the cell isolation regions (FIG. 8(c)).

Subsequently, a wafer of boron nitride (BN) is disposed so as to face the wafer shown in FIG. 8(c) in a diffusion furnace and heated at 800° C. in the atmosphere of $H_2+O_2+N_2$, thereby to deposit a boron glass layer containing an impurity B on the oxide film 5-8 and the n⁻ layer 4-8. Then the substrate is heat-treated at 1100° C. for 5 to 15 min. in a nitrogen atmosphere to diffuse the deposited impurity B in a small thickness.

Then, the boron glass which can cause non-uniform diffusion is removed by hydrofluoric acid $+HNO_3$.

Further, oxidation is carried out at 800° C. in the atmosphere of $H_2+O_2$ for 30 to 60 min. By this oxidation. The boron glass which has not been removed completely and microdefects which have been generated during the deposition of the impurity B, can be taken into the oxide film. The thus formed oxide film is removed by hydrofluoric acid to expose a clean and defect-free surface.

Then, driving-in of the impurity is effected at 950°–1050° C. in an atmosphere of $H_2+O_2$ for 30 to 50 min. to form a p⁺ cell isolation region 6-8 and an oxide film 7-8 (FIG. 8(d)).

In a particular example, the driving-in was effected for 60 min. to form a cell isolation region 6-8 with a sheet resistivity of 20 Ω/□ and a thickness of 1.7 μm.

Alternatively, the p⁺ cell isolation region 6-8 can be formed by forming the oxide film 5-8 as shown in FIG. 8(c), depositing thereon a layer of BSG (boron silicate glass; an $SiO_2$ film containing B as impurity) as a diffusion source by a CVD process and effecting driving-in, similarly as the diffusionn process as described above.

After the p⁺ cell isolation region 6-8 has been formed, the oxide film 7-8 (including the oxide film 5-8) is selectively removed by etching and a buffer oxide film 8-8 is formed thereat in order to form a base region (see FIG. 8(e)). In this step, the back coating oxide film 3-8 is completely removed.

The oxide film 8-8 is formed in a thickness of 500 to 1500 Å for the purpose of preventing channeling and formation of surface defects during the formation of a p base region by ion injection.

Then, B⁺ ions or $BF_2$⁺ ions are injected into the wafer with the use of $BF_3$ as a source gas. At this time, the oxide film 7-8 functions as a mask, whereby B⁺ ions are injected into a portion only below the oxide film 8-8. The surface concentration is $1 \times 10$ to $5 \times 10^{18}$ cm⁻³, preferably 1 to $20 \times 10^{16}$ cm⁻³, and the amount of ion injection is $7 \times 10^{11}$ to $1 \times 10^{15}$ cm⁻², preferably $1 \times 10^{12}$ to $1 \times 10^{14}$ cm⁻².

After the ions have been injected, heat diffusion is effected at 1000° to 1100° C. in an $N_2$ atmosphere to form the p base region 9-8 in a predetermined thickness (FIG. 8(f)). The thickness of the p base region 9-8 is, for example, of the order of 0.6 to 1 μm.

After the cell isolation region 6-8 and the base region 9-8 have thus been formed, the oxide films 7-8 and 8-8 are removed, and an oxide film 10-8 is formed in a thickness of several tens to several hundreds of angstroms (Å) (FIG. 8(g)).

Then, a nitride film 11-8 ($Si_3N_4$) is formed in a thickness of 500 to 1500 Å on the oxide film 10-8 at a temperature of 700° to 900° C. (FIG. 8(h)).

A PSG film 12-8 is further formed on the nitride film 11-8. Then, by applying a photolithography process including two mask alignment steps, all of the oxide film 10-8, nitride film 11-8 and PSG film 12-8 are removed at a portion where an emitter is formed, while the nitride film 11-8 and PSG film 12-8 are removed by etching to leave the oxide film 10-8 at portions where an electrode functioning as the gate of the p-channel MOS transistor and also as an electrode of the capacitor Cox is formed. A resist is applied thereabove and is patterned to leave a patterned resist R-8 so as to form a predetermined length of channel (FIG. 8(i)).

Then, by using the resist R-8 as a mask, B⁺ ions are injected. The amount of ion injection is $5 \times 10^-$ to $1 \times 10^{15}$ cm⁻².

Subsequently, the resist R-8 is removed and heat treatment is effected at 1000° C. for 10 to 30 min. to effect driving-in of the impurity (B) to form p regions a₁ and leave an n⁻ channel with a predetermined length of 1.

Then, an As-doped polysilicon layer is deposited by a CVD process using a mixture gas of $N_2+SiH_4+AsH_3$ or $H_2+SiH_4+AsH_3$. The polysilicon layer is deposited at about 550° C. to 900° C. in a thickness of 2000 to 7000 Å. Instead, non-doped polysilicon may be deposited by a CVD process, followed by diffusion of As or P.

Then, a part of the deposited polysilicon film is selectively removed by a photolithography process including a mask alignment step and an etching step, and the polysilicon formed on the PSG film 12-8 is further removed in a self alignment manner utilizing lifting-off by etching the PSG film 12-8, whereby polysilicon electrodes 13-8 and 14-8 are formed (FIG. 8(k)).

Thereafter, the impurity (As) is diffused from the polysilicon 13-8 into the base region 9-8 by heating, thereby to form an n⁺ emitter region 15-8 (FIG. 8(l)).

Then, a PSG film 16-8 is formed in a thickness of 3000 to 7000 Å by a CVD process using the above described gaseous system, followed by a lithography process including a mask alignment step and an etching step to form a contact hole above the polysilicon 14-8. In the contact hole, an electrode 17-8 of a metal such as Al, Al-Si, Al-Cu-Si, etc., is deposited by vacuum evaporation or sputtering (FIG. 8(m)).

Further, an inter-layer insulating film 18-8 of a PSG film, SiO$_2$ film, etc., is formed in a thickness of 3000 to 6000 Å by a CVD process and a contact hole is formed therethrough over the polysilicon 13-8 through mask alignment and etching steps. A metal electrode 19-8 of Al, Al-Si, Al-Cu-Si etc., is further formed in the contact hole (FIG. 8(n)).

Finally, a passivation film 20-8 of PSG, Si$_3$N$_4$, etc., is formed by a CVD process and a metal electrode 21-8 of Al, Al-Si, Au, etc., on the back surface of the wafer, whereby a structure as shown in FIG. 8(o) is completed.

The description of the production steps shown in FIGS. 8(a) to 8(o) is partially omitted as the emitted portions are substantially the same as the corresponding portions of the production steps explained with reference to FIGS. 4, 5 and 6.

FIGS. 9(a) to 9(k) are sectional views showing a fifth embodiment of the process for producing the semiconductor device according to the present invention, wherein the production of a photoelectric converter is again taken as an example.

First, as shown in FIG. 9(a), an n+ layer 2-9 for ohmic contact with an impurity concentration of $1 \times 10^{17}$ to $1 \times 10^{20}$ cm$^{-3}$ is formed on the back side of an n type silicon substrate 1-9 with an impurity concentration of $1 \times 10^{15}$ to $5 \times 10^{17}$ cm$^{-3}$ by diffusion of P, As or Sb. Then, an oxide film 3-9 (e.g., SiO$_2$ film) is formed on the n+ layer 2-9 by a CVD process in a thickness of 3000 to 7000 Å.

The oxide film 3-9 is called a back coating and is provided for preventing generation of impurity vapor when the substrate 1-9 is heat-treated.

Then, the front surface of the substrate 1-9 is etched for about 1.5 min. under the conditions of a temperature of 1000° C. and the atmosphere of HCl at 2 l/min. and H$_2$ at 60 l/min. Then, on the surface is formed an n$^-$ epitaxial layer 4-9 with the use of a source gas of SiH$_2$Cl$_2$ (100%) flowing at a rate of 1.2 l/min. and a doping gas (H$_2$-diluted PH$_3$, 20 ppm) at a rate of 100 cc/min. under the conditions of a growth temperature of 1000° C. and a reduced pressure of 120 to 180 Torr. The single crystal growth rate at this time is 0.5 $\mu$m/min., the thickness is 2 to 10 $\mu$m, and the impurity concentration is $1 \times 10^{12}$ to $10^{16}$ cm$^{-3}$, preferably $10^{12}$ to $10^{14}$ cm$^{-3}$ (FIG. 9(b)).

In order to improve the quality of the n$^-$ layer 4-9, it is effective to heat the substrate to a high temperature of the order of 1150° to 1250° C. so that the oxygen in the vicinity of the surface is removed and thereafter to heat-treat the substrate for a long time at a temperature of the order of 800° C. so as to cause many microdefects, thereby to make the substrate one having denuded zones which can be subjected to the intrinsic gettering process.

Then, an oxide film 5-9 with a thickness of 4000 to 80,000 Å is formed on the n$^-$ layer 4-9 by pyrogenic oxidation with H$_2$+O$_2$, wet oxidation with O$_2$+H$_2$O or steam oxidation with N$_2$+H$_2$O. Further, in order to obtain a good quality of oxidation film free of lamination defects, etc., high pressure oxidation of 800° to 1000° C. is appropriate.

Then, parts of the oxide film 5-9 are selectively removed by a photolithographic technique in order to form a cell isolation region and a p semiconductor region (hereinafter referred to as "p well") for peripheral element or devices, and a buffer oxide film 6-9 is formed thereat in a thickness of 500 to 1500 Å (FIG. 9(c)).

Then, by using the patterned oxide film 5-9 as a mask, B+ ions are injected at a rate of 1 to $10 \times 10^{12}$ cm$^{-2}$. The impurity is driven in by heat treatment at 1150° to 1200° C. for 5 to 10 hours to form a p well 7-9 and cell isolation regions 8-9 and 9-9, simultaneously (FIG. 9(d)).

Figure 9E:
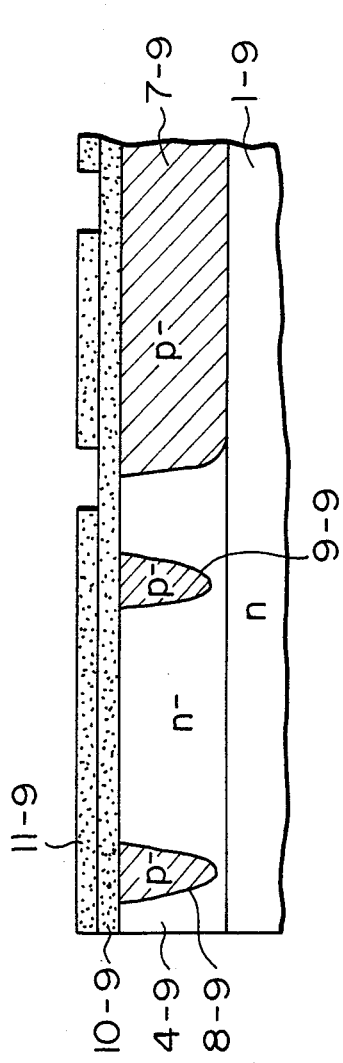
Figure 9F:
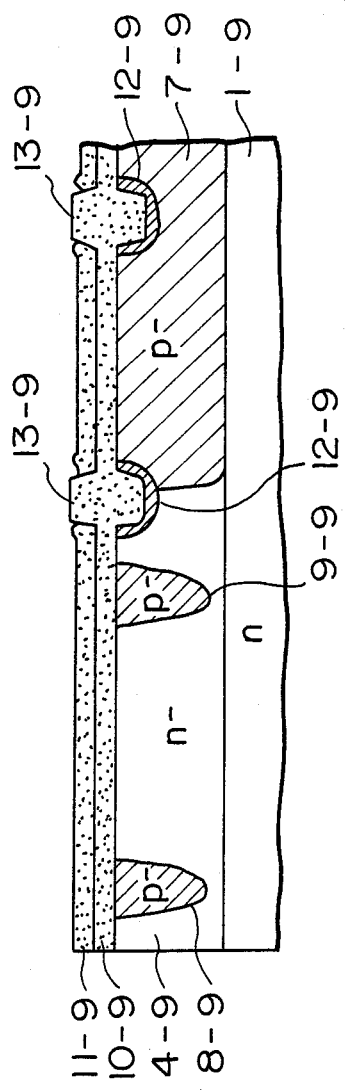

Subsequently, after removing the oxide films 5-9 and 6-9, an oxide film 10-9 in a thickness of 500 to 1500 Å and a nitride film 11-9 (Si$_3$N$_4$) are successively formed, followed by patterning of the nitride film 11-9 for formation of a region (i.e., channel stopper) for isolating peripheral elements (FIG. 9(e)).

Then, by using the patterned nitride film 11-9 as a mask, B+ ions are injected at a rate of 1 to $10 \times 10^{13}$ cm$^{-2}$ and heat treatment is carried out at 1000° C. for 10 min. to form p regions 12-9 as channel stoppers. Thereafter, pyrogenic oxidation is effected at 1000° C. to form isolation regions 13-9 in a thickness of 8000 to 12000 Å.

Figure 9G:
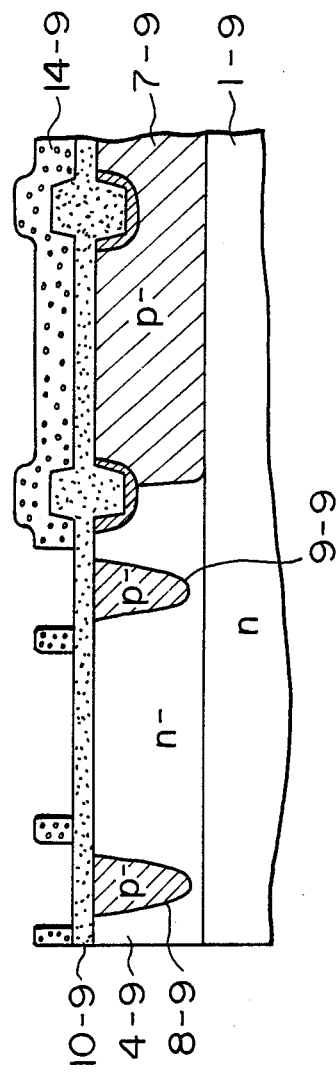
Figure 9H:
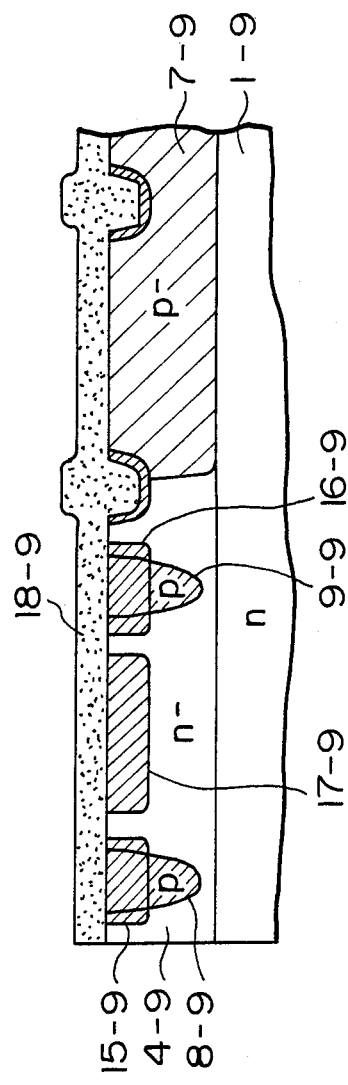

Further, after the nitride film 11-9 is removed, a resist is applied in a thickness of 0.7 to 1.2 $\mu$m on the oxide film 10-9 and is patterned to leave a resist pattern 14-9 for forming base regions and superposed cell isolation regions (FIG. 9(g)).

Then, by using the patterned resist 14-9 as a mask, B+ ions are injected at a rate of $7 \times 10^{11}$ to $1 \times 10^{15}$ cm$^{-2}$. After the resist 14-9 has been removed, heat treatment is effected at 1000° to 1100° C. in an N$_2$ atmosphere to form p regions 15-9 and 16-9 superposing the cell isolation regions 8-9 and 9-9, respectively, and also a base region 17-9. Then, oxidation is effected in H$_2$+O$_2$ gas at 1000° C. for 1 to 2 hours to form an oxide film 18-9 in a thickness of 3000 to 5000 Å which includes the oxide film 10-9 (FIG. 9(h)).

The thickness of the base region 17-9 is, for example, of the order of 0.6 to 1 $\mu$m. The base region 17-9 and p regions 15-9 and 16-9 may also be produced by a process wherein BSG is deposited on the wafer and the impurity B is diffused by heat diffusion at 1100° to 1200° C. into a predetermined thickness.

Figures 9I, 9J:
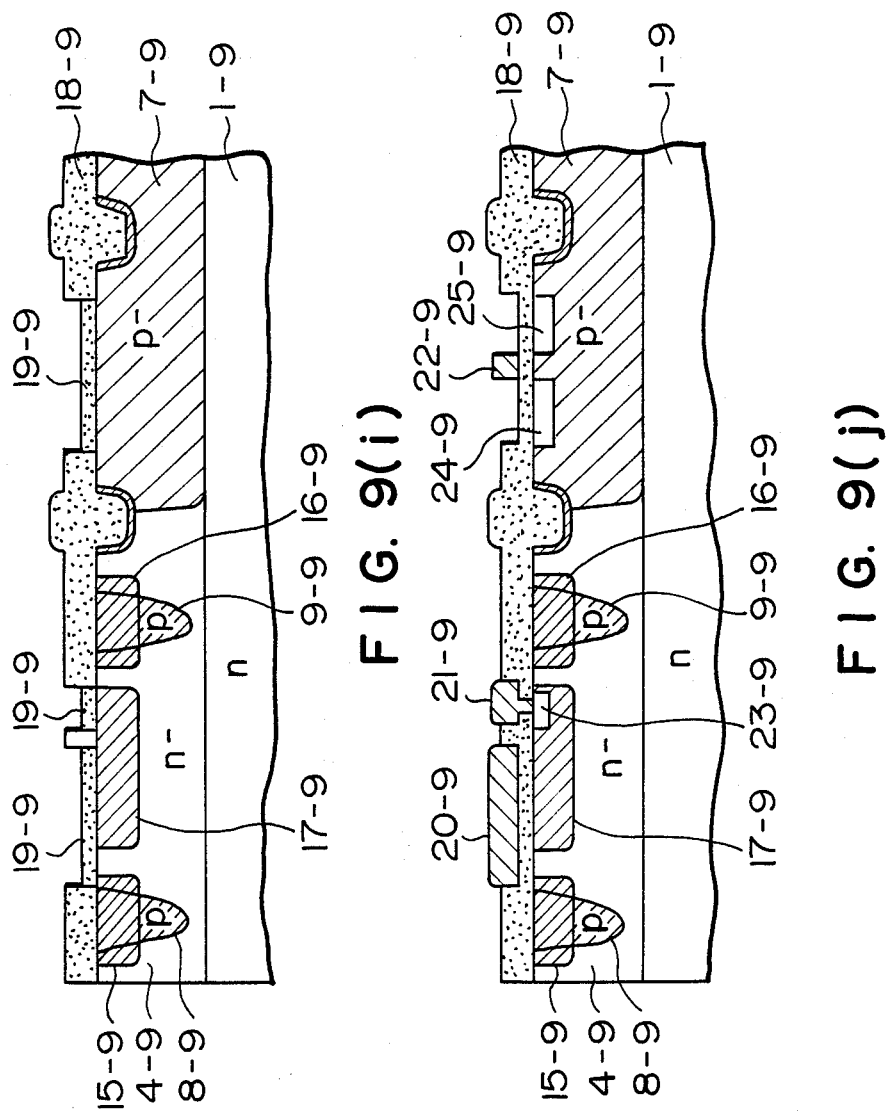

Then, the oxide film 18-9 is patterned, i.e., partially removed for forming a portion of a p channel MOS transistor and a capacitor, a portion of an emitter and a portion of a peripheral element (an n channel MOS transistor in this case), and a gate oxide film 19-9 is formed thereat in a thickness of several tens to several hundreds of Å (FIG. 9(i)).

After the oxide film 19-9 is formed, B+ ions are injected at a rate of $5 \times 10^{10}$ to $1 \times 10^{12}$ cm$^{-2}$. The ion injection is effected in order to determine threshold voltage Vth of the p channel MOS transistor formed between the base region 17-9 and the cell isolation region (p region) 15-9.

Then, the oxide film is partially removed at the portions of an emitter and of the source and drain of the n-channel MOS transistor, and As-doped polysilicon is deposited by a CVD process using a mixture gas of N$_2$+SiH$_4$+AsH$_3$ or H$_2$+SiH$_4$+AsH$_3$. Alternatively, non-doped polysilicon may be deposited by a CVD process, followed by diffusion of As or P.

Then, parts of the deposited polysilicon film are removed by a photolithography process including a mask alignment step and an etching step to form polysilicon electrodes 20, 21 and 22. The etching of the deposited polysilicon is effected by using a gaseous system of C$_2$Cl$_2$F$_4$, CBrF$_3$+Cl$_2$, etc.

Thereafter, the impurity (As) is diffused from the polysilicon 21-9 into the base region 17-9 by heating, thereby to form an n+ emitter region 23-5.

Then, P− or As− ions are injected at a rate of $1\times10^{14}$ to $1\times10^{16}$ cm$^{-2}$. The ions are masked by the field oxide film 18-9 and polysilicons 20-9, 21-9 and 22-9 to be injected into only predetermined portions. Further, heat treatment is effected to form source and drain 24-9 and 25-9 of the n MOS transistor (FIG. 9(j)).

Then, a PSG film 26-9 is formed in a thickness of 3000 to 7000 Å by a CVD process using the above described gaseous system, followed by a lithography process including a mask alignment step and an etching step to form a contact hole above the polysilicon 20-9. In the contact hole, an electrode 27-9 of a metal such as Al, Al-Si, Al-Cu-Si, etc., is deposited by vacuum evaporation or sputtering.

Further, an inter-layer insulating film 28-9 of a PSG film, SiO$_2$ film, etc., is formed in a thickness of 3000 to 6000 Å by a CVD process and a contact hole is formed therethrough over the polysilicone 21-9 and 22-9 through mask alignment and etching steps. Metal electrodes 28-9 and 30-9 of Al, Al-Si, Al-Cu-Si etc., are further formed in the contact hole.

Figure 9K:
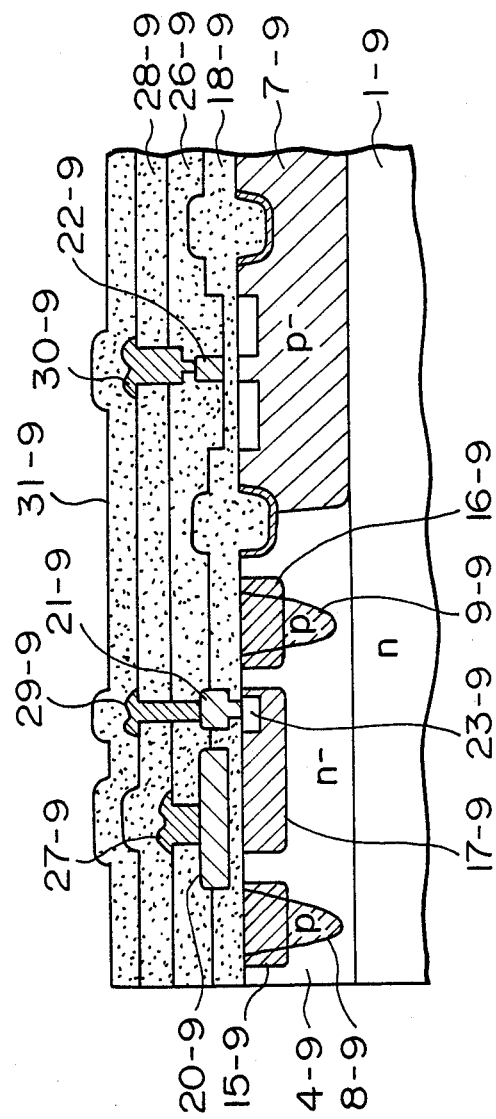

Finally, a passivation film 31-9 of PSG, Si$_3$N$_4$, etc., is formed by a CVD process and a metal electrode 21 of Al, Al-Si, Au, etc., on the back surface of the wafer, whereby a structure as shown in FIG. 9(k) is completed.

In the above described embodiment, an n-channel MOS transistor is taken as an example of a peripheral element or device. Naturally, the peripheral element or device applicable in the present invention is not limited thereto, but may be a C-MOS transistor, etc. More specifically, a peripheral element comprising a semiconductor region having the same conductivity type as that of the cell isolation regions 8-9 and 9-9 may be used.

Other details of the semiconductor device and the production process therefor shown in FIG. 9 will be readily understood from the description relating to FIGS. 3 through 8.

What is claimed is:

1. A semiconductor device comprising:
    a plurality of semiconductor elements arranged in an array, each comprising at least a semiconductor region of one conductivity type;
    a plurality of element isolation regions, each comprising a semiconductor of said one conductivity type and being disposed between each adjacent pair among said plurality of semiconductor elements to electrically isolate the plurality of semiconductor elements independently from each other;
    a potential supply for providing a predetermined potential electrically connected to said element isolation regions; and
    switching means having a first state, in which said semiconductor region of each semiconductor element and a respective one of said element isolation regions are electrically conductive with each other to reset said semiconductor region to the predetermined potentional, and a second state, in which said semiconductor regions are not electrically conductive with any of said element isolation regions.

2. The semiconductor device according to claim 1, wherein
    said semiconductor element is a semiconductor transistor comprising said semiconductor region of one conductivity type as its controlling electrode region and also two main electrode regions of a conductivity type opposite to said one conductivity type of the controlling electrode region; and
    said switching means is an insulated gate type transistor for making said controlling electrode region and said element isolation region electrically conductive with each other.

3. The semiconductor device according to claim 2, wherein the gate of said insulated gate type transistor extends to above said controlling electrode region by the medium of an intermediate insulating layer therebetween, the extended portion of the gate and the controlling electrode region together with the intermediate insulating layer constituting a capacitor.

4. A process for producing a semiconductor device of the type which comprises a semiconductor transistor having a floated controlling electrode region and an element isolation region, the potential of said floated controlling electrode region being controlled through a capacitor; said process comprising forming said element isolation region by repeating at least one time the steps of:
    forming in a semiconductor layer of one conductivity type and from thereabove a semiconductor region of the reverse conductivity type at a part of said semiconductor layer where the element isolation region is formed,
    forming over the semiconductor layer a semiconductor layer of said one conductivity type by epitaxial growth, and
    forming in the epitaxial semiconductor layer and from thereabove a semiconductor region of the opposite conductivity type at the part of the epitaxial semiconductor layer where the element isolation region is formed.

5. A process for producing a semiconductor device of the type which comprises a semiconductor transistor having a controlling electrode region, a capacitor and an insulated gate type transistor so arranged that the potential of said controlling electrode region is controlled through the capacitor and fixed through the insulated gate type transistor; said process comprising:
    forming an element isolation region of the same conductivity as that of the controlling electrode region in the same substrate as the controlling electrode region; and
    disposing a masking material with a predetermined length between the controlling electrode region and the element isolation region, and
    forming additional semiconductor regions of the same conductivity type as that of and contiguous to the controlling electrode region and the element isolation region through the masking material to form a channel of said insulated gate type transistor with a prescribed length corresponding to the predetermined length of said masking material.

6. A process for producing a semiconductor device of the type which comprises a semiconductor element comprising a semiconductor transistor having a controlling electrode region and a capacitor through which the potential of the controlling electrode region is controlled; and a peripheral element, both formed in a semiconductor layer of one conductivity type; said process comprising the steps of:
    simultaneously forming an element isolation region of the opposite conductivity type opposite to said one conductivity type and a semiconductor region of the opposite conductivity type for said peripheral element, and forming through an masking material said controlling electrode region of the opposite conductivity type and simultaneously therewith an additional semiconductor region of the opposite conductivity type to be superposed on and integral with said element isolation region.

* * * * *

UNITED STATES PATENT AND TRADEMARK OFFICE
CERTIFICATE OF CORRECTION

PATENT NO. : 4,794,443
DATED : December 27, 1988
INVENTOR(S) : NOBUYOSHI TANAKA, ET AL.

It is certified that error appears in the above-identified patent and that said Letters Patent is hereby corrected as shown below:

COLUMN 2

Line 64, "and" should read --an--.

COLUMN 3

Line 53, "Referred" should read --Referring--.

COLUMN 9

Line 34, "wafter," should read --wafer,--.
　　Line 63, "oxide film 3:5" should read --oxide film 3-5--.

COLUMN 11

Line 21, "1 X 10" should read --1 X $10^{15}$--.

COLUMN 12

Line 61, "1 X 10-cm$^{-2}$." should read --1 X $10^{14}$cm$^{-2}$.--.

COLUMN 13

Line 8, "tne" should read --the--.

COLUMN 14

Line 31, "p bsse" should read --p base--.

UNITED STATES PATENT AND TRADEMARK OFFICE
CERTIFICATE OF CORRECTION

PATENT NO. : 4,794,443
DATED : December 27, 1988
INVENTOR(S) : NOBUYOSHI TANAKA, ET AL.   Page 2 of 2

It is certified that error appears in the above-identified patent and that said Letters Patent is hereby corrected as shown below:

COLUMN 15

Line 9, "1 X 10 to" should read --1 X $10^{12}$ to--.

COLUMN 16

Line 9, "1 X 10" should read --1 X $10^{15}$--.
Line 39, "5 X 10" should read -- 5 X $10^{13}$--.

COLUMN 18

Line 1, "element" should read --elements--.

COLUMN 21

Line 3, "an" should read --a--.

Signed and Sealed this

Tenth Day of October, 1989

Attest:

DONALD J. QUIGG

Attesting Officer   Commissioner of Patents and Trademarks